(12) United States Patent
Feng et al.

(10) Patent No.: US 11,568,791 B2
(45) Date of Patent: Jan. 31, 2023

(54) SHIFT REGISTER, GATE DRIVING CIRCUIT AND DISPLAY DEVICE

(71) Applicants: HEFEI BOE JOINT TECHNOLOGY CO., LTD., Anhui (CN); BOE TECHNOLOGY GROUP CO., LTD., Beijing (CN)

(72) Inventors: Xuehuan Feng, Beijing (CN); Yongqian Li, Beijing (CN)

(73) Assignees: HEFEI BOE JOINT TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/279,478

(22) PCT Filed: May 25, 2020

(86) PCT No.: PCT/CN2020/092022
§ 371 (c)(1),
(2) Date: Mar. 24, 2021

(87) PCT Pub. No.: WO2020/238833
PCT Pub. Date: Dec. 3, 2020

(65) Prior Publication Data
US 2022/0005400 A1    Jan. 6, 2022

(30) Foreign Application Priority Data
May 29, 2019    (CN) .......................... 201910458518.2

(51) Int. Cl.
*G09G 3/32*    (2016.01)
*G09G 3/20*    (2006.01)
(Continued)

(52) U.S. Cl.
CPC ......... *G09G 3/2092* (2013.01); *G09G 3/3266* (2013.01); *G09G 2310/0286* (2013.01);
(Continued)

(58) Field of Classification Search
CPC .............. G09G 3/2092; G09G 3/3266; G09G 2310/0286; G09G 2310/061; G09G 2310/08; G11C 19/28
See application file for complete search history.

(56) References Cited

U.S. PATENT DOCUMENTS

| | | | |
|---|---|---|---|
| 2013/0100007 A1* | 4/2013 | Yamamoto | G09G 3/36 377/64 |
| 2014/0093028 A1* | 4/2014 | Wu | G11C 19/28 377/64 |
| 2015/0036784 A1* | 2/2015 | Qing | G09G 3/3233 377/68 |
| 2016/0117963 A1 | 4/2016 | Chung | |

(Continued)

FOREIGN PATENT DOCUMENTS

| | | | | |
|---|---|---|---|---|
| CN | 105185294 A | 12/2015 | | |
| CN | 105741742 A | * 7/2016 | ............. | G11C 19/28 |

(Continued)

OTHER PUBLICATIONS

First Office Action dated Sep. 3, 2021 for application No. CN201910458518.2 with English translation attached.

*Primary Examiner* — Adam J Snyder
(74) *Attorney, Agent, or Firm* — Nath, Goldberg & Meyer; Joshua B. Goldberg

(57) ABSTRACT

The present disclosure discloses a shift register, a gate driving circuit and a display device. The shift register includes a display pre-charge reset circuit, a sensing cascade circuit, a sensing pre-charge reset circuit, a pull-down control circuit and an output circuit, where the display pre-charge reset circuit, the sensing cascade circuit and the
(Continued)

sensing pre-charge reset circuit share the same pull-down control circuit and the same output circuit, the output circuit is coupled to at least one signal output terminal, the output circuit includes output sub-circuits in one-to-one correspondence with the at least one signal output terminal, and each output sub-circuit is configured to write a driving clock signal into the corresponding signal output terminal in a display output stage and a sensing output stage in response to a control of a voltage of a pull-up node in an effective level state.

15 Claims, 8 Drawing Sheets

(51) Int. Cl.
*G11C 19/28* (2006.01)
*G09G 3/3266* (2016.01)

(52) U.S. Cl.
CPC ............... *G09G 2310/061* (2013.01); *G09G 2310/08* (2013.01); *G11C 19/28* (2013.01)

(56) References Cited

U.S. PATENT DOCUMENTS

| | | | |
|---|---|---|---|
| 2018/0174503 A1* | 6/2018 | Shim | G09G 3/3266 |
| 2019/0103049 A1* | 4/2019 | Noh | G09G 3/3266 |
| 2020/0135115 A1* | 4/2020 | Chang | G09G 3/3291 |

FOREIGN PATENT DOCUMENTS

| | | | | |
|---|---|---|---|---|
| CN | 106683634 A | | 5/2017 | |
| CN | 107464539 A | * | 12/2017 | ............ G09G 3/20 |
| CN | 107993607 A | | 5/2018 | |
| CN | 108648718 A | | 10/2018 | |
| CN | 108877627 A | | 11/2018 | |
| CN | 109346007 A | | 2/2019 | |
| CN | 109658865 A | | 4/2019 | |
| CN | 109698006 A | | 4/2019 | |
| CN | 109935269 A | | 6/2019 | |
| CN | 109949749 A | | 6/2019 | |
| CN | 110136653 A | | 8/2019 | |

* cited by examiner

SHIFT REGISTER, GATE DRIVING CIRCUIT AND DISPLAY DEVICE

CROSS-REFERENCE TO RELATED APPLICATIONS

This is a National Phase Application filed under 35 U.S.C. 371 as a national stage of PCT/CN2020/092022, filed May 25, 2020, an application claiming the benefit of Chinese Application No. 201910458518.2, filed May 29, 2019, the content of each of which is hereby incorporated by reference in its entirety.

TECHNICAL FIELD

The present disclosure relates to the field of display technology, and in particular, to a shift register, a gate driving circuit, and a display device.

BACKGROUND

Thin film transistors (TFT) may be integrated on an array substrate by adopting a gate driver on array (GOA) technology to scan and drive gate lines in a display panel, so that no gate driving circuit is required, and a realization of a narrow bezel is facilitated.

For a display panel with an external compensation function, each gate driving unit in a gate driving circuit (composed of a plurality of gate driving units which are cascaded) is required to not only output a driving signal for controlling a display switch transistor to be turned on in a display driving stage, but also output a driving signal for controlling a sensing switch transistor to be turned on in a sensing stage, that is, the gate driving unit is required to have a function of outputting double pulses. However, a conventional shift register can output only a single pulse signal, and thus the gate driving unit including only one shift register cannot meet driving requirements.

Two shift registers and a signal combining circuit may be used to form a gate driving unit having a function of outputting double pulses. However, the design scheme of the gate driving unit including two shift registers and one signal combining circuit requires a large number of TFTs, which is not favorable for implementing a narrow bezel.

SUMMARY

The present disclosure provides a shift register, including: a display pre-charge reset circuit, a sensing cascade circuit, a sensing pre-charge reset circuit, a pull-down control circuit and an output circuit; the sensing cascade circuit and the sensing pre-charge reset circuit are coupled to a sensing cascade node, the display pre-charge reset circuit, the sensing pre-charge reset circuit, the pull-down control circuit and the output circuit are coupled to a pull-up node, and the pull-down control circuit and the output circuit are coupled to a pull-down node; the output circuit is coupled to at least one signal output terminal and includes output sub-circuits in one-to-one correspondence with the at least one signal output terminal;

the display pre-charge reset circuit is coupled to a first signal input terminal, a display reset signal terminal, a first power supply terminal and a second power supply terminal, and is configured to write, in response to a control of a first input signal provided by the first signal input terminal in a display pre-charge stage, a first operating voltage, which is provided by the first power supply terminal and is in an effective level state, into the pull-up node; and to write, in response to a control of a first reset signal provided by the display reset signal terminal in a display reset stage, a second operating voltage, which is provided by the second power supply terminal and is in a non-effective level state, into the pull-up node;

the sensing cascade circuit is coupled to a second signal input terminal and a random signal terminal, and is configured to write, in response to a control of a random signal provided by the random signal terminal in a sensing cascade stage, a second input signal, which is provided by the second signal input terminal and is in an effective level state, into the sensing cascade node;

the sensing pre-charge reset circuit is coupled to a first clock signal terminal, a sensing reset signal terminal and the second power supply terminal, and is configured to write, in response to a control of a voltage of the sensing cascade node and a first clock signal provided by the first clock signal terminal in a sensing pre-charge stage, the first clock signal, which is provided by the first clock signal terminal and is in an effective level state, into the pull-up node; and to write, in response to a control of a second reset signal provided by the sensing reset signal terminal in a sensing reset stage, the second operating voltage, which is provided by the second power supply terminal and is in the non-effective level state, into the pull-up node;

the pull-down control circuit is coupled to the first power supply terminal and the second power supply terminal, and is configured to write, in response to that a voltage of the pull-up node is in an effective level state, under a control of the voltage of the pull-up node, the second operating voltage, which is provided by the second power supply terminal and is in the non-effective level state, into the pull-down node; and to write, in response to that the voltage of the pull-up node is in a non-effective level state, under a control of the first operating voltage provided by the first power supply terminal, the first operating voltage provided by the first power supply terminal and in the effective level state into the pull-down node;

each output sub-circuit is coupled to the pull-up node, the pull-down node, a corresponding signal output terminal, a corresponding driving clock signal terminal and a corresponding reset power supply terminal, and is configured to write, in response to a control of the voltage of the pull-up node in an effective level state in a display output stage and a sensing output stage, a driving clock signal provided by the corresponding driving clock signal terminal into the corresponding signal output terminal; and to write, in response to the control of the voltage of the pull-down node in the effective level state in the display reset stage and the sensing reset stage, a reset operating voltage, which is provided by the corresponding reset power supply terminal and is in a non-effective level state, into the corresponding signal output terminal.

In some implementations, the display pre-charge reset circuit includes: a first transistor and a second transistor;

a control electrode of the first transistor is coupled to the first signal input terminal, a first electrode of the first transistor is coupled to the first power supply terminal, and a second electrode of the first transistor is coupled to the pull-up node;

a control electrode of the second transistor is coupled to the display reset signal terminal, a first electrode of the second transistor is coupled to the pull-up node, and a second electrode of the second transistor is coupled to the second power supply terminal.

In some implementations, the sensing cascade circuit includes: a third transistor;

a control electrode of the third transistor is coupled to the random signal terminal, a first electrode of the third transistor is coupled to the second signal input terminal, and a second electrode of the third transistor is coupled to the sensing cascade node.

In some implementations, the shift register further includes a first capacitor, a first terminal of the first capacitor is coupled to the sensing cascade node, and a second terminal of the first capacitor is coupled to the second power supply terminal.

In some implementations, the sensing pre-charge reset circuit includes: a fourth transistor, a fifth transistor, and a sixth transistor;

a control electrode of the fourth transistor is coupled to the sensing cascade node, a first electrode of the fourth transistor is coupled to the first clock signal terminal, and a second electrode of the fourth transistor is coupled to a sensing pre-charge node;

a control electrode of the fifth transistor is coupled to the first clock signal terminal, a first electrode of the fifth transistor is coupled to the sensing pre-charge node, and a second electrode of the fifth transistor is coupled to the pull-up node;

a control electrode of the sixth transistor is coupled to the sensing reset signal terminal, a first electrode of the sixth transistor is coupled to the pull-up node, and a second electrode of the sixth transistor is coupled to the second power supply terminal.

In some implementations, the pull-down control circuit includes: a seventh transistor, an eighth transistor, a ninth transistor, and a tenth transistor;

a control electrode of the seventh transistor is coupled to the first power supply terminal, a first electrode of the seventh transistor is coupled to the first power supply terminal, and a second electrode of the seventh transistor is coupled to a first electrode of the eighth transistor;

a control electrode of the eighth transistor is coupled to the first electrode of the eighth transistor, and a second electrode of the eighth transistor is coupled to the pull-down node;

a control electrode of the ninth transistor is coupled to the pull-up node, a first electrode of the ninth transistor is coupled to the pull-down node, and a second electrode of the ninth transistor is coupled to a first electrode of the tenth transistor;

a control electrode of the tenth transistor is coupled to the pull-up node, and a second electrode of the tenth transistor is coupled to the second power supply terminal.

In some implementations, the shift register further includes: a first noise reduction circuit including an eleventh transistor;

a control electrode of the eleventh transistor is coupled to the pull-down node, a first electrode of the eleventh transistor is coupled to the pull-up node, and a second electrode of the eleventh transistor is coupled to the second power supply terminal.

In some implementations, the at least one signal output terminal includes one signal output terminal, and the shift register further includes a second capacitor, a first terminal of the second capacitor is coupled to the pull-up node, and a second terminal of the second capacitor is coupled to the signal output terminal.

In some implementations, the at least one signal output terminal includes three signal output terminals, the output circuit includes three output sub-circuits, and the shift register further includes a second capacitor and a third capacitor;

a first terminal of the second capacitor is coupled to the pull-up node, and a second terminal of the second capacitor is coupled to one of the signal output terminals corresponding to one output sub-circuit;

a first terminal of the third capacitor is coupled to the pull-up node, and a second terminal of the third capacitor is coupled to one of the signal output terminals corresponding to another output sub-circuit.

In some implementations, each of the output sub-circuits includes: a twelfth transistor and a thirteenth transistor;

a control electrode of the twelfth transistor is coupled to the pull-up node, a first electrode of the twelfth transistor is coupled to the driving clock signal terminal corresponding to the output sub-circuit, and a second electrode of the twelfth transistor is coupled to the signal output terminal corresponding to the output sub-circuit;

a control electrode of the thirteenth transistor is coupled to the pull-down node, a first electrode of the thirteenth transistor is coupled to the signal output terminal corresponding to the output sub-circuit, and a second electrode of the thirteenth transistor is coupled to the reset power supply terminal corresponding to the output sub-circuit.

In some implementations, the shift register further includes: a second noise reduction circuit including a fourteenth transistor and a fifteenth transistor;

a control electrode of the fourteenth transistor is coupled to the first clock signal terminal, a first electrode of the fourteenth transistor is coupled to the pull-down node, and a second electrode of the fourteenth transistor is coupled to a first electrode of the fifteenth transistor;

a control electrode of the fifteenth transistor is coupled to the sensing cascade node, and a second electrode of the fifteenth transistor is coupled to the second power supply terminal.

In some implementations, the shift register further includes: a third noise reduction circuit including a sixteenth transistor;

a control electrode of the sixteenth transistor is coupled to the first signal input terminal, a first electrode of the sixteenth transistor is coupled to the pull-down node, and a second electrode of the sixteenth transistor is coupled to the second power supply terminal.

The present disclosure further provides a gate driving circuit, including N cascaded shift registers, where each of the shift registers is the shift register described above;

first signal input terminals of the shift registers at the first stage and the second stage are coupled to a frame start signal input terminal, the first signal input terminal of the shift register at the $i^{th}$ stage is coupled to one signal output terminal of the shift register at the $(i-2)^{th}$ stage, where i is more than or equal to 3 and less than or equal to N, and i is a positive integer;

the second signal input terminal of the shift register at the first stage is coupled to a sensing start signal input terminal, the second signal input terminal of the shift register at the $j^{th}$ stage is coupled to one signal output terminal of the shift register at the $(j-1)^{th}$ stage, where j is more than or equal to 2 and less than or equal to N, and j is a positive integer;

display reset signal terminals of the shift registers from the $(N-1)^{th}$ stage to the $N^{th}$ stage are coupled to a frame reset signal terminal, the display reset signal terminal of the $k^{th}$ stage is coupled to one signal output terminal of the shift register at the $(k+3)^{th}$ stage, where k is more than or equal to 1 and less than or equal to N-3, and k is a positive integer.

The present disclosure further provides a display device, which includes the gate driving circuit described above.

The present disclosure further provides a shift register including a first transistor, a second transistor, a third transistor, a fourth transistor, a fifth transistor, a sixth transistor, a seventh transistor, an eighth transistor, a ninth transistor, a tenth transistor, an eleventh transistor, a twelfth transistor, a twenty-second transistor, a thirty-second transistor, a thirteenth transistor, a twenty-third transistor, a thirty-third transistor, a fourteenth transistor, a fifteenth transistor, a sixteenth transistor, a first capacitor, a second capacitor, and a third capacitor, a control electrode of the first transistor is coupled to a first signal input terminal, a first electrode of the first transistor is coupled to a first power supply terminal, and a second electrode of the first transistor is coupled to a pull-up node;

a control electrode of the second transistor is coupled to a display reset signal terminal, a first electrode of the second transistor is coupled to the pull-up node, and a second electrode of the second transistor is coupled to a second power supply terminal;

a control electrode of the third transistor is coupled to a random signal terminal, a first electrode of the third transistor is coupled to a second signal input terminal, and a second electrode of the third transistor is coupled to a sensing cascade node;

a control electrode of the fourth transistor is coupled to the sensing cascade node, a first electrode of the fourth transistor is coupled to a first clock signal terminal, and a second electrode of the fourth transistor is coupled to a sensing pre-charge node;

a control electrode of the fifth transistor is coupled to the first clock signal terminal, a first electrode of the fifth transistor is coupled to the sensing pre-charge node, and a second electrode of the fifth transistor is coupled to the pull-up node;

a control electrode of the sixth transistor is coupled to a sensing reset signal terminal, a first electrode of the sixth transistor is coupled to the pull-up node, and a second electrode of the sixth transistor is coupled to the second power supply terminal;

a control electrode of the seventh transistor is coupled to the first power supply terminal, a first electrode of the seventh transistor is coupled to the first power supply terminal, and a second electrode of the seventh transistor is coupled to a first electrode of the eighth transistor;

a control electrode of the eighth transistor is coupled to the first electrode of the eighth transistor, and a second electrode of the eighth transistor is coupled to a pull-down node;

a control electrode of the ninth transistor is coupled to the pull-up node, a first electrode of the ninth transistor is coupled to the pull-down node, and a second electrode of the ninth transistor is coupled to a first electrode of the tenth transistor;

a control electrode of the tenth transistor is coupled to the pull-up node, and a second electrode of the tenth transistor is coupled to the second power supply terminal;

a control electrode of the eleventh transistor is coupled to the pull-down node, a first electrode of the eleventh transistor is coupled to the pull-up node, and a second electrode of the eleventh transistor is coupled to the second power supply terminal;

a control electrode of the twelfth transistor is coupled to the pull-up node, a first electrode of the twelfth transistor is coupled to a first driving clock signal terminal, and a second electrode of the twelfth transistor is coupled to a first signal output terminal;

a control electrode of the twenty-second transistor is coupled to the pull-up node, a first electrode of the twenty-second transistor is coupled to a second driving clock signal terminal, and a second electrode of the twenty-second transistor is coupled to a second signal output terminal;

a control electrode of the thirty-second transistor is coupled to the pull-up node, a first electrode of the thirty-second transistor is coupled to a third driving clock signal terminal, and a second electrode of the thirty-second transistor is coupled to a third signal output terminal;

a control electrode of the thirteenth transistor is coupled to the pull-down node, a first electrode of the thirteenth transistor is coupled to the first signal output terminal, and a second electrode of the thirteenth transistor is coupled to a first reset power supply terminal;

a control electrode of the twenty-third transistor is coupled to the pull-down node, a first electrode of the twenty-third transistor is coupled to the second signal output terminal, and a second electrode of the twenty-third transistor is coupled to a second reset power supply terminal;

a control electrode of the thirty-third transistor is coupled to the pull-down node, a first electrode of the thirty-third transistor is coupled to the third signal output terminal, and a second electrode of the thirty-third transistor is coupled to a third reset power supply terminal;

a control electrode of the fourteenth transistor is coupled to the first clock signal terminal, a first electrode of the fourteenth transistor is coupled to the pull-down node, and a second electrode of the fourteenth transistor is coupled to a first electrode of the fifteenth transistor;

a control electrode of the fifteenth transistor is coupled to the sensing cascade node, and a second electrode of the fifteenth transistor is coupled to the second power supply terminal;

a control electrode of the sixteenth transistor is coupled to the first signal input terminal, a first electrode of the sixteenth transistor is coupled to the pull-down node, and a second electrode of the sixteenth transistor is coupled to the second power supply terminal;

a first terminal of the first capacitor is coupled to the sensing cascade node, and a second terminal of the first capacitor is coupled to the second power supply terminal;

a first terminal of the second capacitor is coupled to the pull-up node, and a second terminal of the second capacitor is coupled to the second signal output terminal; and a first terminal of the third capacitor is coupled to the pull-up node, and a second terminal of the third capacitor is coupled to the third signal output terminal.

DESCRIPTION OF EMBODIMENTS

In order to make those skilled in the art better understand the technical solutions of the present disclosure, the shift register, the gate driving circuit, and the display device provided in the present disclosure are described in detail below with reference to the accompanying drawings.

It should be noted that the transistor in the present disclosure may be a thin film transistor or a field effect transistor or any other switching device with the same characteristics. A transistor generally includes three electrodes, i.e., a gate electrode, a source electrode and a drain electrode, and the source electrode and the drain electrode of the transistor are symmetrical in structure, and may be interchanged as desired. In the present disclosure, the control electrode refers to the gate electrode of the transistor, and one of the first electrode and the second electrode is the source electrode and the other is the drain electrode.

Further, transistors can be classified into N-type transistors and P-type transistors according to transistor characteristics; when the transistor is an N-type transistor, the transistor would be turned on at a high level voltage, and would be turned off at a low level voltage; when the transistor is a P-type transistor, the transistor would be turned on at a low level voltage, and would be turned off at a high level voltage. The "effective level" in the present disclosure refers to a voltage capable of controlling the corresponding transistor to be turned on, and the "non-effective level" refers to a voltage capable of controlling the corresponding transistor to be turned off; accordingly, when the transistor is the N-type transistor, the effective level refers to a high level, and the non-effective level refers to a low level; when the transistor is the P-type transistor, the effective level refers to a low level and the non-effective level refers to a high level, respectively.

In the following description of the embodiments, the transistors are exemplified as being N-type transistors. Accordingly, the effective level refers to a high level, and the non-effective level refers to a low level. Those ordinary skilled in the art will appreciate that the transistors in the embodiments described below may be replaced with P-type transistors.

For an organic light emitting diode display panel with an external compensation function, the display of a frame of picture can be divided into two stages, i.e., a display driving stage and a sensing stage; in the display driving stage, display driving for pixel units in each row in the display panel is completed; in the sensing stage, current drawing (i.e., sensing) for a row of pixel units in the display panel is completed.

Figure 1:
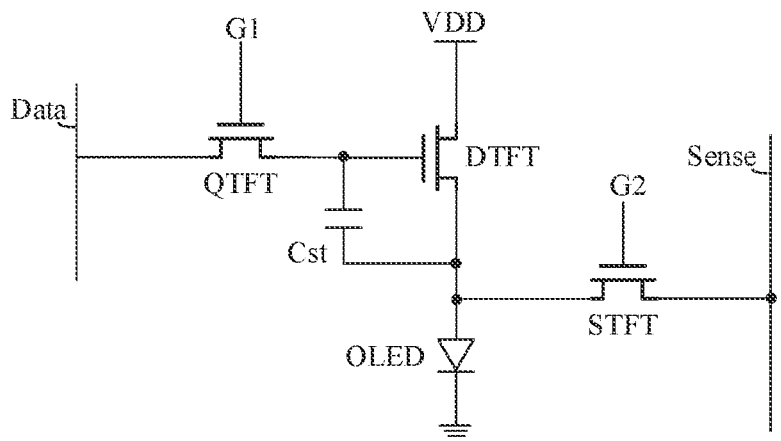
FIG. 1 is a schematic circuit diagram of a pixel circuit in an organic light emitting diode display panel.
Figure 2:
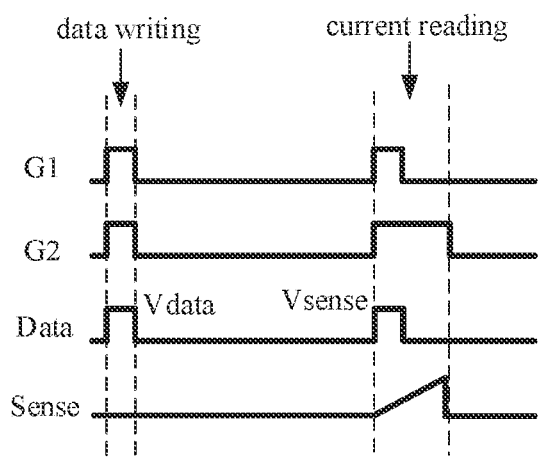
FIG. 2 is a timing diagram illustrating an operation of the pixel circuit shown in FIG. 1.

FIG. 1 is a schematic circuit diagram of a pixel circuit in an organic light emitting diode display panel, and FIG. 2 is a timing diagram illustrating an operation of the pixel circuit shown in FIG. 1, and as shown in FIG. 1 and FIG. 2, the pixel circuit includes a display switch transistor QTFT (a control electrode thereof is coupled to a gate line G1), a driving transistor DTFT, a sensing switch transistor STFT (a control electrode thereof is coupled to a gate line G2), and a capacitor Cst. When an external compensation is needed to be performed on the pixel circuit, the pixel circuit at least includes following two stages in a working process, that is, a pixel driving stage (including a data voltage writing process) and a pixel sensing stage (including a current reading process).

In the pixel driving stage, a data voltage Vdata in a data line Data needs to be written into the pixel unit; in the pixel sensing stage, a test voltage Vsense needs to be written into the pixel unit through the data line Data, and an electrical signal at the drain electrode of the driving transistor is read to a signal read line Sense through the sensing switch transistor STFT. In both the data voltage writing process and the current reading process, it is necessary to write an effective level voltage to the gate electrode of the sensing switch transistor STFT through the corresponding gate line G2.

It should be noted that, as for the process of performing external compensation on the pixel unit in the organic light emitting diode display panel, reference may be made to conventional technologies in the art, and the present disclosure does not specifically limit this process, so detailed descriptions of a specific compensation process and a principle thereof are omitted here.

Since a duration of the current reading process is longer than that of the data voltage writing process, it is necessary, for the gate line G2 coupled to the gate electrode of the sensing switch transistor STFT, to output a double pulse signal within a time duration of a frame, and a pulse width corresponding to the current reading process is larger than that corresponding to the data voltage writing process. This requires the gate driving unit to have a function of outputting double pulses having different pulse widths.

Figure 3:
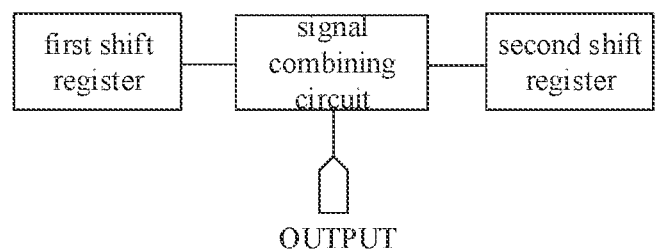
FIG. 3 is a schematic structural diagram of a gate driving unit.

FIG. 3 is a schematic structural diagram of a gate driving unit, and as shown in FIG. 3, in order to enable the gate driving unit to output a double pulse signal, a first shift register, a second shift register and a signal combining circuit may be used to form the gate driving unit. In the gate driving circuit, first shift registers in all gate driving units are cascaded, second shift registers in all gate driving units are cascaded, the first shift registers are configured to output driving signals for driving display switch transistors in a display driving stage, the second shift registers are configured to output driving signals for driving sensing switch transistors in a sensing stage, the signal combining circuit combines the driving signals output by two shift registers located in the same gate driving unit, and outputs a double pulse signal through a signal output terminal OUTPUT to meet driving requirements.

Although the technical solution of forming the gate driving unit by two shift registers and the signal combining circuit can satisfy the driving requirement, the structure is complex and the number of transistors required to be arranged is large, which is not favorable for a narrow bezel design.

The technical solution of the present disclosure provides a shift register, which has a function of outputting double pulses and can meet the driving requirements of a pixel circuit in a pixel driving stage and a pixel sensing stage, and thus the shift register in the present disclosure may be independently used as a gate driving unit. Compared with the technical solution of the gate driving unit including two shift registers and one signal combining circuit, the technical solution of the present disclosure can significantly reduce the number of transistors in the gate driving unit, which facilitates to realize a narrow bezel.

Figure 4:
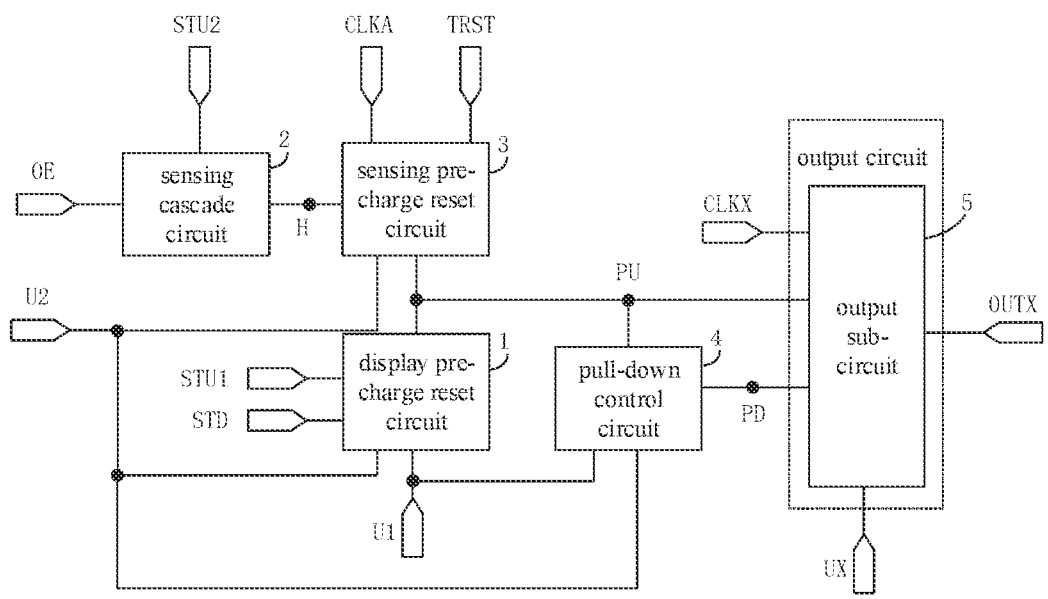
FIG. 4 is a schematic circuit diagram of a shift register according to an embodiment of the present disclosure.

FIG. 4 is a schematic circuit diagram of a shift register provided in an embodiment of the present disclosure, and as shown in FIG. 4, the shift register includes: a display pre-charge reset circuit 1, a sensing cascade circuit 2, a sensing pre-charge reset circuit 3, a pull-down control circuit 4 and an output circuit, where the sensing cascade circuit 2 and the sensing pre-charge reset circuit 3 are coupled to a sensing cascade node H, the display pre-charge reset circuit 1, the sensing pre-charge reset circuit 3, the pull-down control circuit 4 and the output circuit are coupled to a pull-up node PU, and the pull-down control circuit 4 and the output circuit are coupled to a pull-down node PD; the output circuit is coupled to at least one signal output terminal OUTX, and the output circuit includes output sub-circuits 5 in one-to-one correspondence with the at least one signal output terminal OUTX.

The display pre-charge reset circuit 1 is coupled to a first signal input terminal STU1, a display reset signal terminal STD, a first power supply terminal U1, and a second power supply terminal U2, and is configured to, in a display pre-charge stage, write a first operating voltage in an effective level state provided by the first power supply terminal U1 into the pull-up node PU in response to a control of a first input signal provided by the first signal input terminal STU1; in a display reset stage, write a second operating voltage in a non-effective level state provided by the second power supply terminal U2 into the pull-up node PU in response to a control of a first reset signal provided by the display reset signal terminal STD.

The sensing cascade circuit 2 is coupled to a second signal input terminal STU2 and a random signal terminal OE, and is configured to write a second input signal in an effective level state provided by the second signal input terminal STU2 into the sensing cascade node H in response to a control of a random signal provided by the random signal terminal OE during a sensing cascade stage.

The sensing pre-charge reset circuit 3 is coupled to a first clock signal terminal CLKA, a sensing reset signal terminal TRST and the second power supply terminal U2, and is configured to write, in a sensing pre-charge stage, a first clock signal in an effective level state provided by the first clock signal terminal CLKA into the pull-up node PU in response to a control of a voltage of the sensing cascade node H and the first clock signal provided by the first clock signal terminal CLKA; and write, in a sensing reset stage, the second operating voltage in the non-effective level state provided by the second power supply terminal U2 into the pull-up node PU in response to a control of a second reset signal provided by the sensing reset signal terminal TRST.

The pull-down control circuit 4 is coupled to the first power supply terminal U1 and the second power supply terminal U2, and is configured to write the second operating voltage in the non-effective level state provided by the second power supply terminal U2 into the pull-down node PD in response to a control of a voltage of the pull-up node PU when the voltage of the pull-up node PU is in an effective level state; and write the first operating voltage in the effective level state provided by the first power supply terminal U1 into the pull-down node PD in response to a control of the first operating voltage provided by the first power supply terminal U1 when the voltage of the pull-up node PU is in a non-effective level state.

The output sub-circuit 5 is coupled to the pull-up node PU, the pull-down node PD, a corresponding signal output terminal OUTX, a corresponding driving clock signal terminal CLKX, and a corresponding reset power supply terminal UX, and is configured to write a driving clock signal provided by the corresponding driving clock signal terminal CLKX into the corresponding signal output terminal OUTX in response to a control of a voltage of the pull-up node PU in an effective level state in a display output stage and a sensing output stage; and write a reset operating voltage in a non-effective level state provided by the corresponding reset power supply terminal UX into the corresponding signal output terminal OUTX in response to a control of a voltage of the pull-down node PD in an effective level state in the display reset stage and the sensing reset stage.

In some implementations, the number of signal output terminals OUTX is 1 to 3; accordingly, the number of output sub-circuits 5 is 1 to 3; accordingly, the number of driving clock signal terminals CLKX is 1 to 3, and the number of reset power supply terminals UX is 1 to 3. It should be noted that, FIG. 4 only illustrates the case of one output sub-circuit 5, one signal output terminal OUTX, one driving clock signal terminal CLKX, and one reset power supply terminal UX, which does not limit the technical solution of the present disclosure. In the embodiment, when the number of the output sub-circuits 5 is multiple (2 or 3), the driving clock signal terminals CLKX corresponding to the multiple output sub-circuits 5 may be the same clock signal terminal or different clock signal terminals; the reset power supply terminals UX corresponding to the output sub-circuits 5 may be the same power supply terminal or different power supply terminals.

As can be seen from the above description, in the embodiment, the display pre-charge reset circuit 1 and the sensing pre-charge reset circuit 3 share the pull-down control circuit 4 and the output circuit.

In contrast, in the gate driving unit including two shift registers and one signal combining circuit, the first shift register for outputting the driving signal for driving the display switch transistor in the display driving stage at least includes one display pre-charge reset circuit, one pull-down control circuit, and one output circuit; the second shift register for outputting the driving signal for driving the sensing switch transistor in the sensing stage at least includes one sensing cascade circuit, one sensing pre-charge reset circuit, one pull-down control circuit and one output circuit. Therefore, the gate driving unit including two shift registers and one signal combining circuit at least includes one display pre-charge reset circuit, one sensing cascade circuit, one sensing pre-charge reset circuit, two pull-down control circuits, two output circuits and one signal combining circuit.

The shift register provided in the embodiment can independently constitute a gate driving unit, and thus the gate driving unit in the present disclosure includes one display pre-charge reset circuit 1, one sensing cascade circuit 2, one sensing pre-charge reset circuit 3, one pull-down control circuit 4, and one output circuit. Compared with the gate driving unit including two shift registers and one signal combining circuit, the shift register provided by the embodiment can save one pull-down control circuit and one output circuit by sharing the pull-down control circuit and the output circuit; meanwhile, the shift register provided by the embodiment does not need to be provided with the signal combining circuit. Therefore, compared with the gate driving unit including two shift registers and one signal combining circuit, the gate driving unit including the shift register provided by the present disclosure can save one pull-down control circuit, one output circuit and the signal combining circuit, and therefore, in practical applications, the shift register provided by the embodiment can reduce the number of thin film transistors (TFTs) in the gate driving unit, which is beneficial to the implementation of a narrow bezel.

Figure 5:
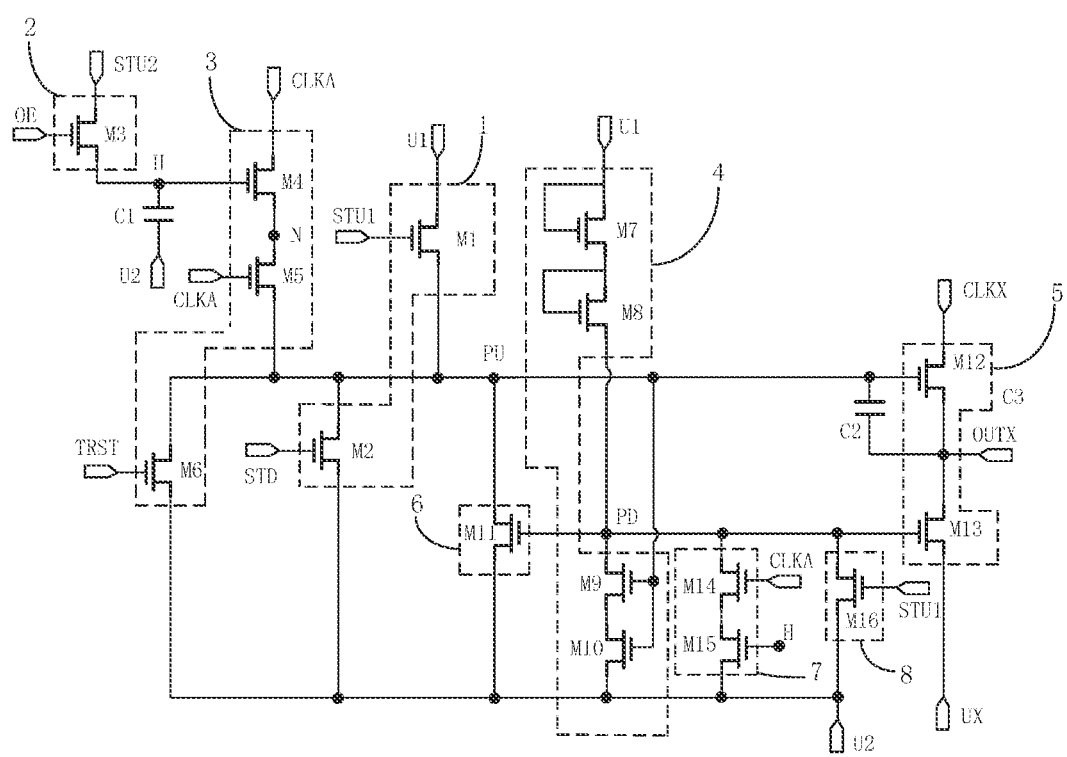
FIG. 5 is a schematic circuit diagram of a shift register according to an embodiment of the present disclosure.

FIG. 5 is a schematic circuit diagram of a shift register provided in an embodiment of the present disclosure, and the shift register shown in FIG. 5 is a specific scheme based on the shift register shown in FIG. 4.

In the embodiment, as shown in FIG. 5, the display pre-charge reset circuit 1 includes: a first transistor M1 and a second transistor M2.

A control electrode of the first transistor M1 is coupled to the first signal input terminal STU1, a first electrode of the first transistor M1 is coupled to the first power supply terminal U1, and a second electrode of the first transistor M1 is coupled to the pull-up node PU. The first power supply terminal U1 is configured to provide the first operating voltage in the effective level state, for example, the first operating voltage is a high level voltage VDD.

A control electrode of the second transistor M2 is coupled to the display reset signal terminal STD, a first electrode of the second transistor M2 is coupled to the pull-up node PU, and a second electrode of the second transistor M2 is coupled to the second power supply terminal U2. The second power supply terminal U2 is configured to provide the second operating voltage in the non-effective level state, for example, the second operating voltage is a low level voltage VGL1.

In the embodiment, as shown in FIG. 5, the sensing cascade circuit 2 includes: a third transistor M3; a control electrode of the third transistor M3 is coupled to the random signal terminal OE, a first electrode of the third transistor M3 is coupled to the second signal input terminal STU2, and a second electrode of the third transistor M3 is coupled to the sensing cascade node H. The random signal terminal OE may be a random signal terminal implemented based on an FPGA (Field Programmable Gate Array), and configured to provide a random signal.

In some implementations, as shown in FIG. 5, the shift register further includes: a first capacitor C1, where a first terminal of the first capacitor C1 is coupled to the sensing cascade node H, and a second terminal of the first capacitor C2 is coupled to the second power supply terminal U2. The first capacitor C1 is configured to maintain the voltage of the sensing cascade node H stable when the third transistor M3 is turned off.

In the embodiment, as shown in FIG. 5, the sensing pre-charge reset circuit 3 includes: a fourth transistor M4, a fifth transistor M5, and a sixth transistor M6. A control electrode of the fourth transistor M4 is coupled to the sensing cascade node H, a first electrode of the fourth transistor M4 is coupled to the first clock signal terminal CLKA, and a second electrode of the fourth transistor M4 is coupled to a sensing pre-charge node N.

A control electrode of the fifth transistor M5 is coupled to the first clock signal terminal CLKA, a first electrode of the fifth transistor M5 is coupled to the sensing pre-charge node N, and a second electrode of the fifth transistor M5 is coupled to the pull-up node PU. In some implementations, signal terminals to which the control electrode of the fifth transistor M5 and the first electrode of the fourth transistor M4 are coupled may be different signal terminals, and the embodiment is not limited to the way in which the control electrode of the fifth transistor M5 and the first electrode of the fourth transistor M4 are coupled to the same first clock signal terminal CLKA.

A control electrode of the sixth transistor M6 is coupled to the sensing reset signal terminal TRST, a first electrode of the sixth transistor M6 is coupled to the pull-up node PU, and a second electrode of the sixth transistor M6 is coupled to the second power supply terminal U2.

In the embodiment, as shown in FIG. 5, the pull-down control circuit 4 includes: a seventh transistor M7, an eighth transistor M8, a ninth transistor M9, and a tenth transistor M10.

A control electrode of the seventh transistor M7 is coupled to the first power supply terminal U1, a first electrode of the seventh transistor M7 is coupled to the first power supply terminal U1, and a second electrode of the seventh transistor M7 is coupled to a first electrode of the eighth transistor M8.

A control electrode of the eighth transistor M8 is coupled to the first electrode of the eighth transistor M8, and a second electrode of the eighth transistor M8 is coupled to the pull-down node PD.

A control electrode of the ninth transistor M9 is coupled to the pull-up node PU, a first electrode of the ninth transistor M9 is coupled to the pull-down node PD, and a second electrode of the ninth transistor M9 is coupled to a first electrode of the tenth transistor M10.

A control electrode of the tenth transistor M10 is coupled to the pull-up node PU, and a second electrode of the tenth transistor M10 is coupled to the second power supply terminal U2.

In some implementations, the pull-down control circuit 4 may include only the seventh transistor M7 and the ninth transistor M9, in such case, the second electrode of the seventh transistor is coupled to the pull-down node PD, and the second electrode of the ninth transistor M9 is coupled to the second power supply terminal U2.

In the embodiment, in the pull-down control circuit 4, an impedance between the first power supply terminal U1 and the second power supply terminal U2 can be increased and a current between the first power supply terminal U1 and the second power supply terminal U2 can be effectively reduced by the seventh transistor M7 and the eighth transistor M8 which are cascaded, and the ninth transistor M9 and the tenth transistor M10 which are cascaded, and thus a phenomenon that wiring of the second power supply terminal U2 is easily blown in an overcurrent state lasting for a long time can be effectively prevented. Through simulation tests, in the case where the pull-down control circuit 4 does not include the eighth transistor M8 and the tenth transistor M10, the current flowing through the ninth transistor M9 is 12 μA, and in the case where the pull-down control circuit 4 includes the eighth transistor M8 and the tenth transistor M10, the current flowing through the ninth transistor M9 is 6 μA.

In addition, since the transistor (TFT) in the embodiment is a depletion type TFT, a threshold voltage Vth thereof is liable to be in a negative value state, and therefore, before the display pre-charge stage, since the control electrode of the ninth transistor M9 is in the non-effective level state (e.g. at the low level voltage VGL1), the second electrode of the ninth transistor M9 is in the non-effective level state (e.g. at the low level voltage VGL1), the first electrode of the ninth transistor M9 is in the effective level state (e.g. at the high level voltage VDD), the ninth transistor M9 is in a leakage state, but in the embodiment, in the pull-down control circuit 4, the seventh transistor M7 is cascaded to the eighth transistor M8, the ninth transistor M9 is cascaded to the tenth transistor M10, thereby increasing the impedance between the first power supply terminal U1 (a power source supplying the high level voltage VDD) and the second power supply terminal U2 (a power source supplying the low level voltage VGL1), thereby effectively preventing the leakage of the transistor.

In some implementations, as shown in FIG. 5, the shift register further includes: a first noise reduction circuit 6 coupled to the pull-up node PU and the pull-down node PD, and the first noise reduction circuit 6 is coupled to the second power supply terminal U2, and is configured to write, when the voltage of the pull-up node PU is in the non-effective level state, in response to a control of the voltage of the pull-down node PD, the second operating voltage in the non-effective level state, which is provided by the second power supply terminal U2, into the pull-up node PU, so as to release noise from the pull-up node PU, and maintain stability of the voltage at the pull-up node PU.

In some implementations, as shown in FIG. 5, the first noise reduction circuit 6 includes: an eleventh transistor M11, where a control electrode of the eleventh transistor M11 is coupled to the pull-down node PD, a first electrode of the eleventh transistor M11 is coupled to the pull-up node PU, and a second electrode of the eleventh transistor M11 is coupled to the second power supply terminal U2.

In the embodiment, as shown in FIG. 5, the output sub-circuit 5 includes: a twelfth transistor M12 and a thirteenth transistor M13.

A control electrode of the twelfth transistor M12 is coupled to the pull-up node PU, a first electrode of the twelfth transistor M12 is coupled to the driving clock signal terminal CLKX corresponding to the output sub-circuit 5, and a second electrode of the twelfth transistor M12 is coupled to the signal output terminal OUTX corresponding to the output sub-circuit 5.

A control electrode of the thirteenth transistor M13 is coupled to the pull-down node PD, a first electrode of the thirteenth transistor M13 is coupled to the signal output terminal OUTX corresponding to the output sub-circuit 5, and a second electrode of the thirteenth transistor M13 is coupled to the reset power supply terminal UX corresponding to the output sub-circuit.

In the embodiment, as shown in FIG. 5, one signal output terminal OUTX is included, accordingly, one output sub-circuit 5 is included, one reset signal terminal UX is included, and one driving clock signal terminal CLKX is included.

In the embodiment, as shown in FIG. 5, the shift register further includes: a second capacitor C2, a first terminal of the second capacitor C2 is coupled to the pull-up node PU, and a second terminal of the second capacitor C2 is coupled to the signal output terminal OUTX. The second capacitor C2 can be configured to ensure that the voltage of the pull-up node PU is always in the effective level state during the display output stage and the sensing output stage. In the embodiment, the second capacitor C2 may be a parasitic capacitor of the twelfth transistor M12 or an external capacitor.

In some implementations, as shown in FIG. 5, the shift register further includes: a second noise reduction circuit 7, where the second noise reduction circuit 7 is coupled to the pull-down node PD and the sensing cascade node H, and the second noise reduction circuit 7 is coupled to the first clock signal terminal CLKA and the second power supply terminal U2, and is configured to write, in the sensing pre-charge stage, in response to a control of the voltage of the sensing cascade node H and the first clock signal provided by the first clock signal terminal CLKA, the second operating voltage in the non-effective level state provided by the second power supply terminal U2 into the pull-down node PD, so as to perform noise reduction processing on the pull-down node PD, so as to maintain the voltage at the pull-down node PD stable.

In some implementations, as shown in FIG. 5, the second noise reduction circuit 7 includes a fourteenth transistor M14 and a fifteenth transistor M15, where a control electrode of the fourteenth transistor M14 is coupled to the first clock signal terminal CLKA, a first electrode of the fourteenth transistor M14 is coupled to the pull-down node PD, a second electrode of the fourteenth transistor M14 is coupled to a first electrode of the fifteenth transistor M15, a control electrode of the fifteenth transistor M15 is coupled to the sensing cascade node H, and a second electrode of the fifteenth transistor M15 is coupled to the second power supply terminal U2.

In some implementations, as shown in FIG. 5, the shift register further includes: a third noise reduction circuit 8, where the third noise reduction circuit 8 is coupled to the pull-down node PD, and the third noise reduction circuit 8 is coupled to the first signal input terminal STU1 and the second power supply terminal U2, and is configured to write, in the display pre-charge stage, the second operating voltage in the non-effective level state provided by the second power supply terminal U2 into the pull-down node PD in response to a control of the first input signal provided by the first signal input terminal STU1, so as to perform noise reduction processing on the pull-down node PD, so as to maintain the voltage at the pull-down node PD stable.

In some implementations, as shown in FIG. 5, the third noise reduction circuit 8 includes a sixteenth transistor M16, a control electrode of the sixteenth transistor M16 is coupled to the first signal input terminal STU1, a first electrode of the sixteenth transistor M16 is coupled to the pull-down node PD, and a second electrode of the sixteenth transistor M16 is coupled to the second power supply terminal U2.

In order to facilitate better understanding of the technical solutions of the present disclosure, the operation of the shift register shown in FIG. 5 will be described in detail below with reference to the accompanying drawings. Assume that all transistors in the embodiment are transistors to be turned on by a high level, the first operating voltage provided by the first power supply terminal is a direct-current (DC) high level voltage VDD, the second operating voltage provided by the second power supply terminal is a low level voltage VGL1, the reset operating voltage provided by the reset power supply terminal UX is a low level voltage VGL2, VGL1 is lower than VGL2, and VGL1 and VGL2 are both negative.

Figure 6:
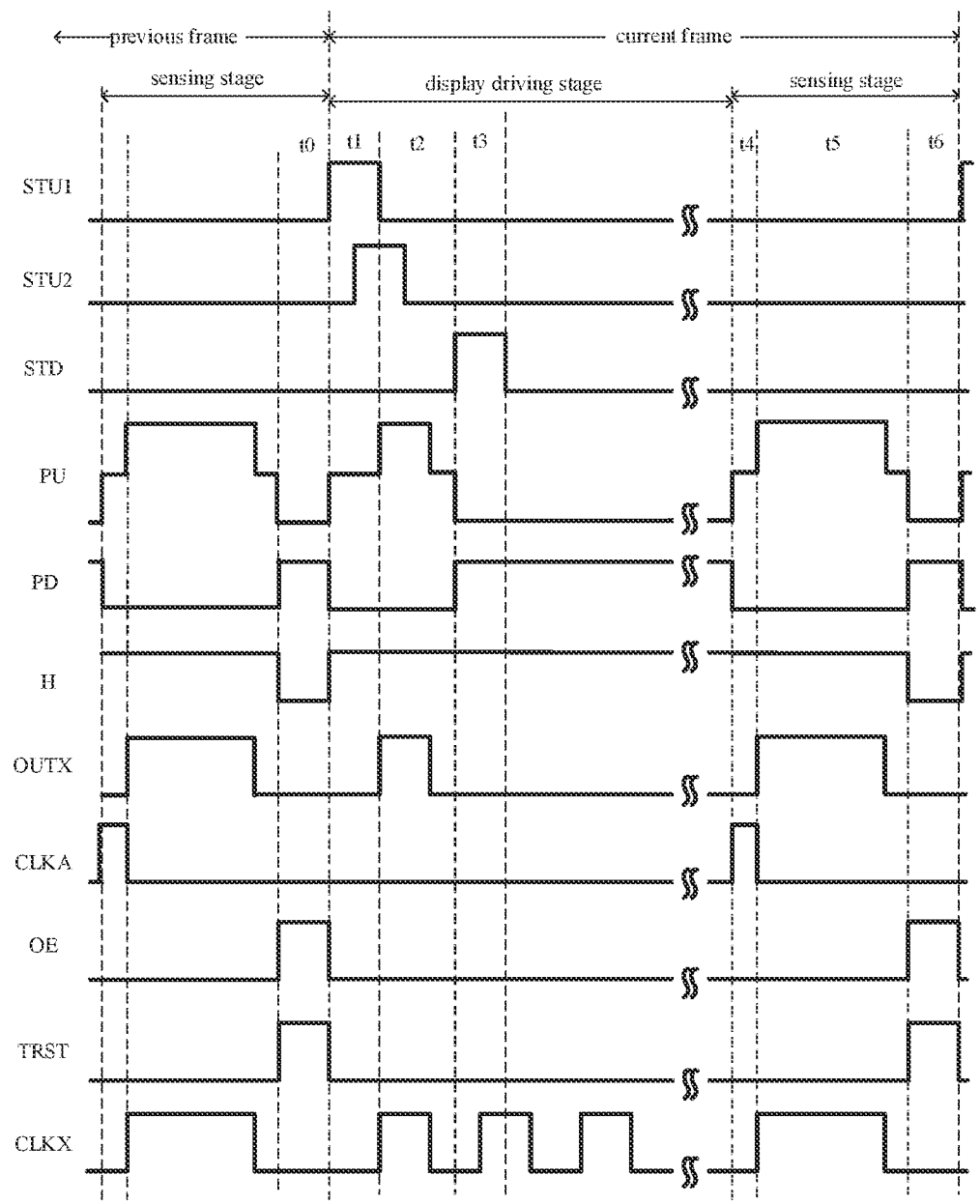
FIG. 6 is a timing diagram illustrating an operation of the shift register shown in FIG. 5.

FIG. 6 is a timing diagram showing the operation of the shift register shown in FIG. 5, and as shown in FIG. 5 and FIG. 6, the operation of the shift register includes the following seven stages, i.e., t0 to t6.

In the sensing cascade stage t0 (in the sensing stage of a previous frame), the first input signal provided by the first signal input terminal STU1 is in a low level state, the second input signal provided by the second signal input terminal STU2 is in a low level state, the first reset signal provided by the display reset signal terminal STD is in a low level state, the first clock signal provided by the first clock signal terminal CLKA is in a low level state, the random signal provided by the random signal terminal OE is in a high level state, the second reset signal provided by the sensing reset signal terminal TRST is in a high level state, the first operating voltage VDD provided by the first power supply terminal U1 is in a high level state, the second operating voltage VGL1 provided by the second power supply terminal U2 is in a low level state, the driving clock signal provided by the driving clock signal terminal CLKX corresponding to the output sub-circuit 5 is in a low level state, and the reset operating voltage VGL2 provided by the reset signal terminal UX is in a low level state.

In such case, the third transistor M3 is turned on under the control of the random signal (being a high level signal) provided by the random signal terminal OE, the second input signal (being a low level signal) provided by the second signal input terminal STU2 is written into the sensing cascade node H through the third transistor M3 being turned on, and the voltage of the sensing cascade node H is in a low level state. The fourth transistor M4 is turned off under the control of the voltage (being a low level voltage) of the sensing cascade node H. Since the first clock signal is in the low level state at this time, the fifth transistor M5 is turned off. Since the sixth transistor M6 is turned on under the control of the second reset signal (being a high level signal) provided by the sensing reset signal terminal TRST, the second operating voltage VGL1 provided by the second power supply terminal U2 is written into the pull-up node PU through the sixth transistor M6 being turned on, and the pull-up node PU is in a low level state.

Since the first input signal provided by the first signal input terminal STU1 and the first reset signal provided by the display reset signal terminal STD are both in the low level state, both the first transistor M1 and the second transistor M2 are turned off.

Since the voltage of the pull-up node PU is in the low level state, the ninth transistor M9, the tenth transistor M10, and the twelfth transistor M12 are all turned off, meanwhile, in the pull-down control circuit 4, under the control of the first operating voltage VDD provided by the first power supply terminal U1, the seventh transistor M7 and the eighth transistor M8 are turned on, the first operating voltage VDD provided by the first power supply terminal U1 is written into the pull-down node PD through the seventh transistor M7 and the eighth transistor M8 which are turned on, and the voltage of the pull-down node PD is in a high level state. In such case, the thirteenth transistor M13 is turned on under the control of the voltage of the pull-down node PD (being a high level voltage), and the reset operating voltage VGL2 provided by the reset power supply terminal UX corresponding to the output sub-circuit 5 is written into the corresponding signal output terminal OUTX through the thirteenth transistor M13 being turned on, that is, the signal output terminal OUTX outputs a low level signal.

In the display pre-charge stage t1, the first input signal provided by the first signal input terminal STU1 is in a high level state, the second input signal provided by the second signal input terminal STU2 is first in a low level state and is switched to the high level state after a period of time, the first reset signal provided by the display reset signal terminal STD is in the low level state, the first clock signal provided by the first clock signal terminal CLKA is in the low level state, the random signal provided by the random signal terminal OE is in the low level state, the second reset signal provided by the sensing reset signal terminal TRST is in the low level state, and the driving clock signal provided by the driving clock signal terminal CLKX is in the low level state.

In such case, since the random signal provided by the random signal terminal OE and the second reset signal provided by the sensing reset signal terminal TRST are both in the low level state, both the third transistor M3 and the sixth transistor M6 are turned off, the sensing cascade node H is in a floating state, and the voltage of the sensing cascade node H maintains in the high level state of a previous stage. It should be noted that, since the third transistor M3 is turned off, the second input signal provided by the second signal input terminal STU2 does not affect the voltage of the sensing cascade node H, whether the second input signal is in a high level state or a low level state.

In addition, the first capacitor C1 in the embodiment can maintain the voltage of the sensing cascade node H stable after the sensing cascade stage t0 ends and when the sensing cascade node H is in the floating state; since the first clock signal is still in the low level state, the fifth transistor M5 maintains turned off.

Meanwhile, since the first input signal provided by the first signal input terminal STU1 is in the high level state and the first reset signal provided by the display reset signal terminal STD is in the low level state, the first transistor M1 is turned on and the second transistor M2 is turned off, the first operating voltage VDD provided by the first power supply terminal U1 can be written into the pull-up node PU through the first transistor M1 being turned on, and the voltage of the pull-up node PU is in a high level state.

Since the voltage of the pull-up node PU is in the high level state, the ninth transistor M9, the tenth transistor M10 and the twelfth transistor M12 are turned on under the control of the voltage of the pull-up node PU, the second operating voltage VGL1 provided by the second power supply terminal U2 is written into the pull-down node PD through the ninth transistor M9 and the tenth transistor M10 which are turned on, at this time, the seventh transistor M7 and the eighth transistor M8 are equivalent to a resistor, and the voltage of the pull-down node PD is in a low level state, and thus the eleventh transistor M11 and the thirteenth transistor M13 are turned off. Meanwhile, the driving clock signal provided by the driving clock signal terminal CLKX is written into the corresponding signal output terminal OUTX through the twelfth transistor M12 being turned on, but since the driving clock signal is in a low level state, the corresponding signal output terminal OUTX outputs a low level signal.

In addition, the sixteenth transistor M16 is turned on under the control of the first input signal (being at the high level) provided by the first signal input terminal STU1, and the second operating voltage VGL1 provided by the second power supply terminal U2 is written into the pull-down node PD through the sixteenth transistor M16 being turned on, so that the noise reduction processing is performed on the pull-down node PD to maintain the voltage at the pull-down node PD stable.

In the display output stage t2, the first input signal provided by the first signal input terminal STU1 is in a low level state, the second input signal provided by the second signal input terminal STU2 is first in a high level state and is switched to a low level state after a period of time, the first reset signal provided by the display reset signal terminal STD is in a low level state, the first clock signal provided by the first clock signal terminal CLKA is in a low level state, the random signal provided by the random signal terminal OE is in a low level state, the second reset signal provided by the sensing reset signal terminal TRST is in a low level state, and the driving clock signal provided by the driving clock signal terminal CLKX is first in a high level state and is switched to a low level state after a period of time.

In such case, since the random signal provided by the random signal terminal OE and the second reset signal provided by the sensing reset signal terminal TRST are both in the low level state, the third transistor M3 and the sixth transistor M6 are both turned off, the sensing cascade node H is in the floating state, and the voltage of the sensing cascade node H maintains in the high level state of a previous stage (the second input signal does not affect the voltage of the sensing cascade node H); since the first clock signal provided by the first clock signal terminal CLKA is still in the low level state, the fifth transistor M5 maintains turned off.

Since the first input signal provided by the first signal input terminal STU1 and the first reset signal provided by the display reset signal terminal STD are both in the low level state, the first transistor M1 and the second transistor M2 are both turned off, the pull-up node PU is in the floating state and maintains in the high level state of a previous stage, the ninth transistor M9, the tenth transistor M10 and the twelfth transistor M12 maintain to be turned on, the pull-down node PD maintains in the low level state, the eleventh transistor M11 and the thirteenth transistor M13 are both turned off, and the driving clock signal provided by the driving clock signal terminal CLKX is written into the corresponding signal output terminal OUTX through the twelfth transistor M12 being turned on.

As shown in FIG. 6, at an initial time of the display driving stage t2, the driving clock signal provided by the driving clock signal terminal CLKX is switched from the low level state to the high level state, and the signal output terminal OUT outputs the high level signal. Meanwhile, under bootstrap action of the second capacitor C2, the voltage of the pull-up node PU is pulled up to a higher level state. In the embodiment, assuming that the voltage corresponding to each clock signal is VGH when it is in the high level state and VGL (approximately 0V) when it is in the low level state, then, during the display pre-charge stage t1, the voltage of the pull-up node PU is approximately VGH and at the initial time of the display driving stage t2, the voltage of the pull-up node PU can be pulled up to approximately 2VGH. After a period of time, the driving clock signal is switched from the high level state to the low level state, and then the signal output terminal OUTX outputs a low level signal; meanwhile, under bootstrap action of the second capacitor C2, the voltage of the pull-up node PU decreases to the level at the initial time of the display driving stage t2, i.e., to VGH, and the pull-up node PU is still in a high level state.

In the display reset stage t3, the first input signal provided by the first signal input terminal STU1 is in a low level state, the second input signal provided by the second signal input terminal STU2 is in a low level state, the first reset signal provided by the display reset signal terminal STD is in a high level state, the first clock signal provided by the first clock signal terminal CLKA is in a low level state, the random signal provided by the random signal terminal OE is in a low level state, the second reset signal provided by the sensing reset signal terminal TRST is in a low level state, and the driving clock signal provided by the driving clock signal terminal CLKX is first in a low level state and is switched to a high level state after a period of time.

In such case, since the random signal provided by the random signal terminal OE and the second reset signal provided by the sensing reset signal terminal TRST are both in the low level state, the third transistor M3 and the sixth transistor M6 are both turned off, the sensing cascade node H is in the floating state, and the voltage of the sensing cascade node H maintains in the high level state of a previous stage (the second input signal does not affect the voltage of the sensing cascade node H); since the first clock signal provided by the first clock signal terminal CLKA is still in the low level state, the fifth transistor M5 maintains turned off.

Since the first input signal provided from the first signal input terminal STU1 is in the low level state, the first transistor M1 is turned off, and since the first reset signal provided by the display reset signal terminal STD is in the high level state, the second transistor M2 is turned on, the second operating voltage VGL1 provided by the second power supply terminal U2 is written into the pull-up node PU through the second transistor M2 being turned on, and the voltage of the pull-up node PU is pulled down to a low level state.

Since the voltage of the pull-up node PU is in the low level state, the ninth transistor M9, the tenth transistor M10, and the twelfth transistor M12 are all in turned off. Since the twelfth transistor M12 is turned off, the driving clock signal provided by the driving clock signal terminal CLKX cannot be written into the signal output terminal OUTX, and thus, the voltage of the signal output terminal OUTX is not affected. In the pull-down control circuit 4, the seventh transistor M7 and the eighth transistor M8 are turned on under the control of the first operating voltage VDD provided by the first power supply terminal U1, the first operating voltage VDD provided by the first power supply terminal U1 is written into the pull-down node PD through the seventh transistor M7 and the eighth transistor M8 which are turned on, the voltage of the pull-down node PD becomes in a high level state, at this time, both the eleventh transistor M11 and the thirteenth transistor M13 are turned on, the second operating voltage VGL1 provided by the second power supply terminal U2 is written into the pull-up node PU through the eleventh transistor M11 being turned on, so as to reduce the noise the pull-up node PU, and meanwhile, the reset operating voltage VGL2 provided by the reset power supply terminal UX is written into the signal output terminal OUTX through the thirteenth transistor M13 being turned on, that is, the signal output terminal OUTX outputs a low level signal.

In the sensing pre-charge stage t4, the first input signal provided by the first signal input terminal STU1 is in a low level state, the second input signal provided by the second signal input terminal STU2 is in a low level state, the first reset signal provided by the display reset signal terminal STD is in a low level state, the first clock signal provided by the first clock signal terminal CLKA is in a high level state, the random signal provided by the random signal terminal OE is in a low level state, the second reset signal provided by the sensing reset signal terminal TRST is in a low level state, and the driving clock signal provided by the driving clock signal terminal CLKX is in a low level state.

In such case, since the random signal provided by the random signal terminal OE and the second reset signal provided by the sensing reset signal terminal TRST are both in the low level state, the third transistor M3 and the sixth transistor M6 are both turned off, the sensing cascade node H is in the floating state, the voltage of the sensing cascade node H maintains in the high level state of a previous stage (the second input signal does not affect the voltage of the sensing cascade node H), and accordingly the fourth transistor M4 maintains turned on. Meanwhile, since the first clock signal provided by the first clock signal terminal CLKA is in the high level state, the fifth transistor M5 is turned on, the first clock signal in the high level state is written into the pull-up node PU through the fourth transistor M4 and fifth transistor M5, which are turned on, in sequence, and the voltage of the pull-up node PU is in a high level state.

Since both the first input signal provided by the first signal input terminal STU1 and the first reset signal provided by the display reset signal terminal STD are in the low level state, both the first transistor M1 and the second transistor M2 are turned off.

Since the voltage of the pull-up node PU is in the high level state, the ninth transistor M9, the tenth transistor M10, and the twelfth transistor M12 are all turned on, the second operating voltage VGL1 provided by the second power supply terminal U2 is written into the pull-down node PD through the ninth transistor M9 and the tenth transistor M10 which are turned on, at this time, the seventh transistor M7 and the eighth transistor M8 are equivalent to a resistor, the voltage of the pull-down node PD is in a low level state, and the eleventh transistor M11 and the thirteenth transistor M13 are both turned off. Meanwhile, the driving clock signal provided by the driving clock signal terminal CLKX is written into the corresponding signal output terminal OUTX through the twelfth transistor M12 being turned on, but since the driving clock signal is in the low level state, the signal output terminal OUTX outputs a low level signal.

In addition, since the first clock signal provided by the first clock signal terminal CLKA is in the high level state and the voltage of the sensing cascade node H is in the high level state, both the fourteenth transistor M14 and the fifteenth transistor M15 are turned on, and the second operating voltage VGL1 in the non-effective level state (low level state) provided by the second power supply terminal U2 is written into the pull-down node PD, thereby reducing noise of the pull-down node PD to maintain the voltage in the pull-down node PD stable.

In the sensing output stage t5, the first input signal provided by the first signal input terminal STU1 is in a low level state, the second input signal provided by the second signal input terminal STU2 is in a low level state, the first reset signal provided by the display reset signal terminal STD is in a low level state, the first clock signal provided by the first clock signal terminal CLKA is in a low level state, the random signal provided by the random signal terminal OE is in a low level state, the second reset signal provided by the sensing reset signal terminal TRST is in a low level state, and the driving clock signal provided by the driving clock signal terminal CLKX is first in a high level state first and is switched to a low level state after a period of time.

In such case, since the random signal provided by the random signal terminal OE and the second reset signal provided by the sensing reset signal terminal TRST are both in the low level state, the third transistor M3 and the sixth transistor M6 are both turned off, the sensing cascade node H is in the floating state, the voltage of the sensing cascade node H maintains in the high level state of a previous stage (the second input signal does not affect the voltage of the sensing cascade node H), and the fourth transistor M4 maintains turned on; since the first clock signal provided by the first clock signal terminal CLKA is in the low level state, the fifth transistor M5 is turned off, and the first clock signal does not affect the voltage of the pull-up node PU.

Since the first input signal provided by the first signal input terminal STU1 and the reset signal provided by the display reset signal terminal STD are both in the low level state, the first transistor M1 and the second transistor M2 are both turned off, the pull-up node PU is in the floating state and maintains in the high level state of a previous stage, the ninth transistor M9, the tenth transistor M10 and the twelfth transistor M12 are maintained to be turned on, the pull-down node PD is maintained in the low level state, the eleventh transistor M11 and the thirteenth transistor 13 are maintained to be turned off, and the driving clock signal provided by the driving clock signal terminal CLKX is written into the corresponding signal output terminal OUTX through the twelfth transistor M12 being turned on.

At an initial time of the sensing output stage t5, the driving clock signal is switched from the low level state to the high level state, and the signal output terminal OUTX outputs a high level signal. Meanwhile, under bootstrap action of the second capacitor C2, the voltage of the pull-up node PU is pulled up to a higher level state. In the embodiment, assuming that the voltage corresponding to each clock signal is VGH when it is at a high level and VGL (approximately 0V) when it is at a low level, the voltage of the pull-up node PU is approximately VGH during the sensing pre-charge stage t4, and the voltage of the pull-up node PU can be pulled up to approximately 2VGH at the initial time of the sensing driving stage t5. After a period of time, the driving clock signal is switched from the high level state to a low level state, and then the signal output terminal OUTX outputs a low level signal; meanwhile, under bootstrap action of the second capacitor C2, the voltage of the pull-up node PU decreases to the level at the initial time of the sensing driving period t5, i.e., to VGH, and at this time, the pull-up node PU is still in the high level state.

In the sensing reset stage t6, the first input signal provided by the first signal input terminal STU1 is in a low level state, the second input signal provided by the second signal input terminal STU2 is in a low level state, the first reset signal provided by the display reset signal terminal STD is in a low level state, the first clock signal provided by the first clock signal terminal CLKA is in a low level state, the random signal provided by the random signal terminal OE is in a high level state, the second reset signal provided by the sensing reset signal terminal TRST is in a high level state, and the driving clock signal provided by the driving clock signal terminal CLKX is in a low level state.

Since the random signal provided by the random signal terminal OE and the second reset signal provided by the sensing reset signal terminal TRST are both in the high level state, the third transistor M3 and the sixth transistor M6 are both turned on, the second input signal provided by the second signal input terminal STU2 is written into the sensing cascade node H through the third transistor M3 being turned on, the voltage of the sensing cascade node H is in a low level state, and the fourth transistor M4 is turned off, so that the sensing cascade node H is totally reset. Since the first clock signal is in the low level state, the fifth transistor M5 is turned off.

Since the sixth transistor M6 is turned on, the second operating voltage VGL1 provided by the second power supply terminal U2 is written into the pull-up node PU through the second transistor M2 being turned on, and the voltage of the pull-up node PU is in a low level state, so that the pull-up node PU is totally reset.

Since the first input signal is in the low level state and the first reset signal is in the low level state, both the first transistor M1 and the second transistor M2 are turned off.

Since the voltage of the pull-up node PU is in the low level state, the ninth transistor M9, the tenth transistor M10, and the twelfth transistor M12 are all turned off; in the pull-down control circuit 4, the first operating voltage VDD provided by the first power supply terminal U1 is written into the pull-down node PD through the seventh transistor M7 and the eighth transistor M8 which are turned on, the voltage of the pull-down node PD is in a high level state, at this time, the eleventh transistor M11 and the thirteenth transistor M13 are turned on, the second operating voltage VGL1 provided by the second power supply terminal U2 is written into the pull-up node PU through the eleventh transistor M11 to reduce noise of the pull-up node PU, and the reset operating voltage VGL2 provided by the reset power supply terminal UX is written into the signal output terminal OUTX through the thirteenth transistor M13, that is, the signal output terminal OUTX outputs a low level signal.

Therefore, the shift register can respectively output high level (effective level) signals in the display driving stage and the sensing stage of a frame to meet the driving requirements of pixel units in a corresponding row.

In the embodiment, the voltage of the pull-up node PU is maintained at the low level (non-effective level) during a period from an end of the display reset stage t3 to a start of the sensing pre-charge stage t4. By providing the eleventh transistor M11, the pull-down control circuit 4 and the eleventh transistor M11 can form a positive feedback loop to strengthen the voltage at the pull-up node PU. Specifically, when the voltage of the pull-up node PU is in the low level state, the pull-down control circuit 4 controls the voltage of the pull-down node PD to be in the high level state, the eleventh transistor M11 is turned on, and the second operating voltage VGL1 is written into the pull-up node PU through the eleventh transistor M11, so as to strengthen that the voltage of the pull-up node PU is in the low level state (the voltage is VGL1), thereby achieving a purpose of reducing noise.

Figure 7:
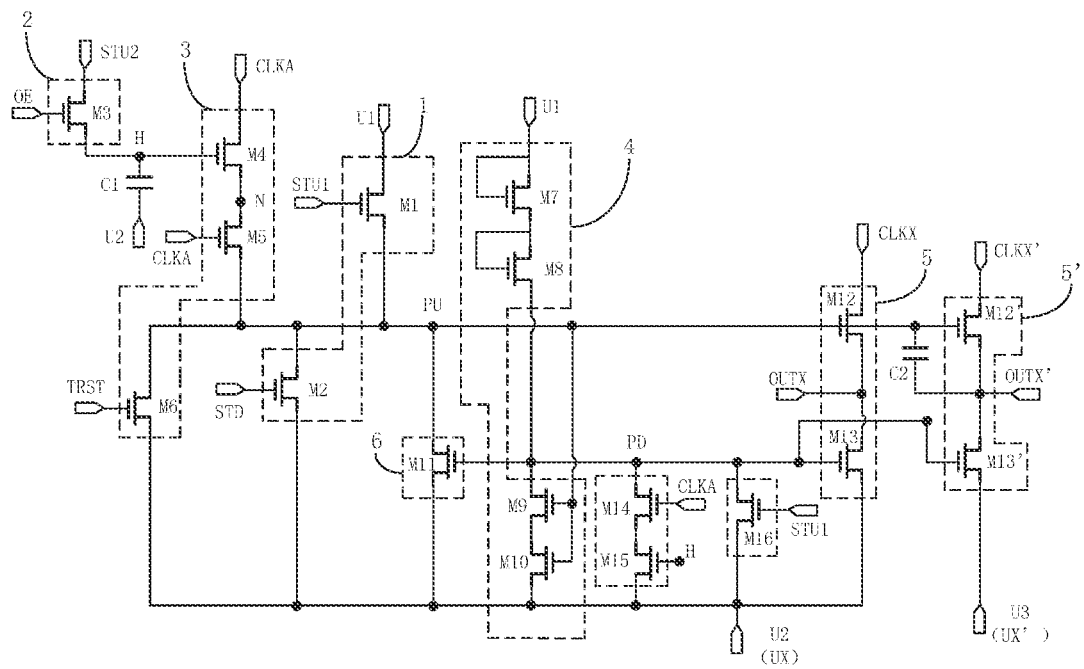
FIG. 7 is a schematic circuit diagram of a shift register according to an embodiment of the present disclosure.

FIG. 7 is another schematic circuit diagram of a shift register according to an embodiment of the present disclosure, and as shown in FIG. 7, different from the foregoing embodiment, in the present embodiment, the number of output sub-circuits is two, and accordingly, the number of signal output terminals is two, the number of driving clock signal terminals is two, and the number of reset power supply terminals is two. For convenience of distinction, in this embodiment, as shown in FIG. 7, the two output sub-circuits are a first output sub-circuit 5 and a second output sub-circuit 5', the two signal output terminals are a signal output terminal OUTX and a signal output terminal OUTX', the two driving clock signal terminals are a driving clock signal terminal CLKX and a driving clock signal terminal CLKX', and the two reset power supply terminals are a reset power supply terminal UX and a reset power supply terminal UX', respectively.

In the embodiment, as shown in FIG. 7, the first output sub-circuit 5 includes a twelfth transistor M12 and a thirteenth transistor M13, and for the specific connection relationship of the twelfth transistor M12 and the thirteenth transistor M13, reference may be made to the description of the twelfth transistor and the thirteenth transistor in the foregoing embodiment, and details are not repeated here; the second output sub-circuit 5' includes a transistor M12' and a transistor M13', similarly, for the specific connection relationship of the transistor M12' and the transistor M13', reference may be made to the description of the twelfth transistor and the thirteenth transistor in the foregoing embodiment, and details are not repeated here.

In the embodiment, the twelfth transistor M12 in the first output sub-circuit 5 and the transistor M12' in the second output sub-circuit 5' are turned on or off at the same time, and the thirteenth transistor M13 in the first output sub-circuit 5 and the transistor M13' in the second output sub-circuit 5' are turned on or off at the same time.

In the embodiment, the driving clock signal provided by the driving clock signal terminal CLKX coupled to the first output sub-circuit 5 and the driving clock signal provided by the driving clock signal terminal CLKX' coupled to the second output sub-circuit 5' may be the same or different.

In some implementations, the driving clock signal terminal CLKX coupled to the first output sub-circuit 5 provides the same driving clock signal as the driving clock signal terminal CLKX' coupled to the second output sub-circuit 5'. In such case, one of the two signal output terminals OUTX/OUTX' (e.g., the signal output terminal OUTX in FIG. 7) serves to supply a cascade signal to another shift register in the gate driving circuit (see the following), and the other (e.g., the signal output terminal OUTX' in FIG. 7) serves to supply a driving signal to the gate line G2 coupled to the control electrode of the sensing switch transistor STFT in the pixel unit of the corresponding row (see FIG. 1).

In the above solution, the signal output terminal for providing the cascade signal is separated from the signal output terminal for providing the driving signal, so that the load on the signal output terminal for providing the driving signal can be reduced, and the stability of the driving signal output by the shift register to the corresponding row of gate line can be ensured.

Figure 8:
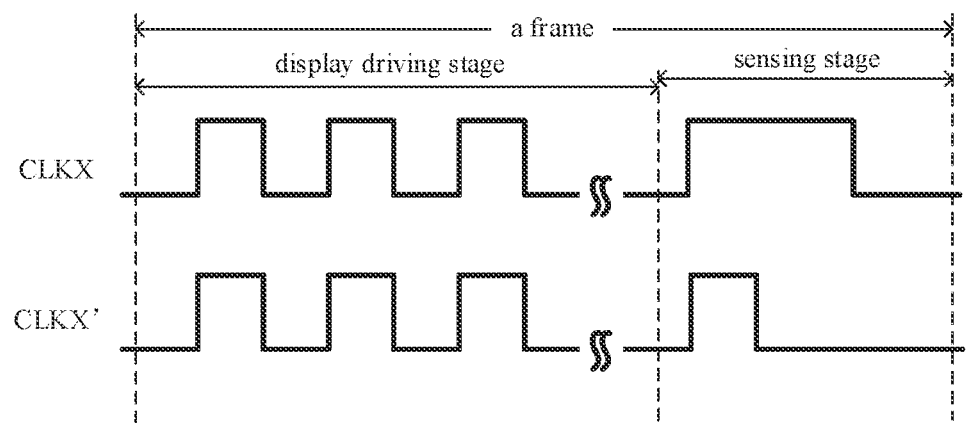
FIG. 8 is a timing diagram of two driving clock signal terminals CLKX/CLKX' of FIG. 7 providing different driving clock signals.

In some implementations, the driving clock signal terminal CLKX coupled to the first output sub-circuit 5 provides a driving clock signal different from that provided by the driving clock signal terminal CLKX' coupled to the second output sub-circuit 5'. FIG. 8 is a timing diagram of different driving clock signals provided by the two driving clock signal terminals CLKX/CLKX' of FIG. 7, and as shown in FIG. 8, the two driving clock signal terminals CLKX/CLKX' provide the same driving clock signal in the display driving stage, but providing different driving clock signals in the sensing stage; the driving clock signal provided by the driving clock signal terminal CLKX corresponds to the driving signal required by the gate line G2 coupled to the control electrode of the sensing switch transistor STFT in the pixel unit (see FIG. 1), and the driving clock signal provided by the driving clock signal terminal CLKX' corresponds to the driving signal required by the gate line G1 coupled to the control electrode of the display switch transistor QTFT (see FIG. 1).

In such case, one of the two signal output terminals OUTX/OUTX' (e.g., the signal output terminal OUTX in FIG. 7) is configured to provide a cascade signal to another shift register in the gate driving circuit and simultaneously provide a driving signal to the gate line G2 coupled to the control electrode of the sensing switch transistor STFT in the pixel unit of the corresponding row, and the other (e.g., the signal output terminal OUTX' in FIG. 7) is configured to provide a driving signal to the gate line G1 coupled to the control electrode of the display switch transistor QTFT in the pixel unit of the corresponding row.

In the above solution, one shift register can simultaneously provide driving signals for two gate lines coupled to pixel units, so that no additional shift register needs to be provided for the gate line G1 coupled to the control electrode of the display switch transistor QTFT, the number of shift registers in the display panel can be effectively reduced, and a design of narrow bezel is facilitated.

In the embodiment, the reset power supply terminal UX coupled to the first output sub-circuit 5 and the reset power supply terminal UX' coupled to the second output sub-circuit 5' may be a same power supply terminal or different power supply terminals.

In some implementations, as shown in FIG. 7, the reset power supply terminal UX coupled to the first output sub-circuit 5 is the second power supply terminal U2, and the reset power supply terminal UX' coupled to the second output sub-circuit 5' is a third power supply terminal U3, where the second operating voltage VGL1 provided by the second power supply terminal U2 is lower than a third operating voltage VGL2 provided by the third power supply terminal U3, and VGL1 and VGL2 are both negative.

In some implementations, the reset power supply terminal UX coupled to the first output sub-circuit 5 and the reset power supply terminal UX' coupled to the second output sub-circuit 5' are both the third power supply terminal U3, and the third power supply terminal U3 is configured to provide the third operating voltage VGL2.

In the embodiment, a first terminal of the second capacitor C2 is coupled to the pull-up node PU, and a second terminal of the second capacitor C2 is coupled to the signal output terminal OUTX' corresponding to the second output sub-circuit 5'.

In addition, for other descriptions of the shift register provided in the embodiment, reference may be made to the description of the foregoing embodiment, and details are not repeated here.

Figure 9:
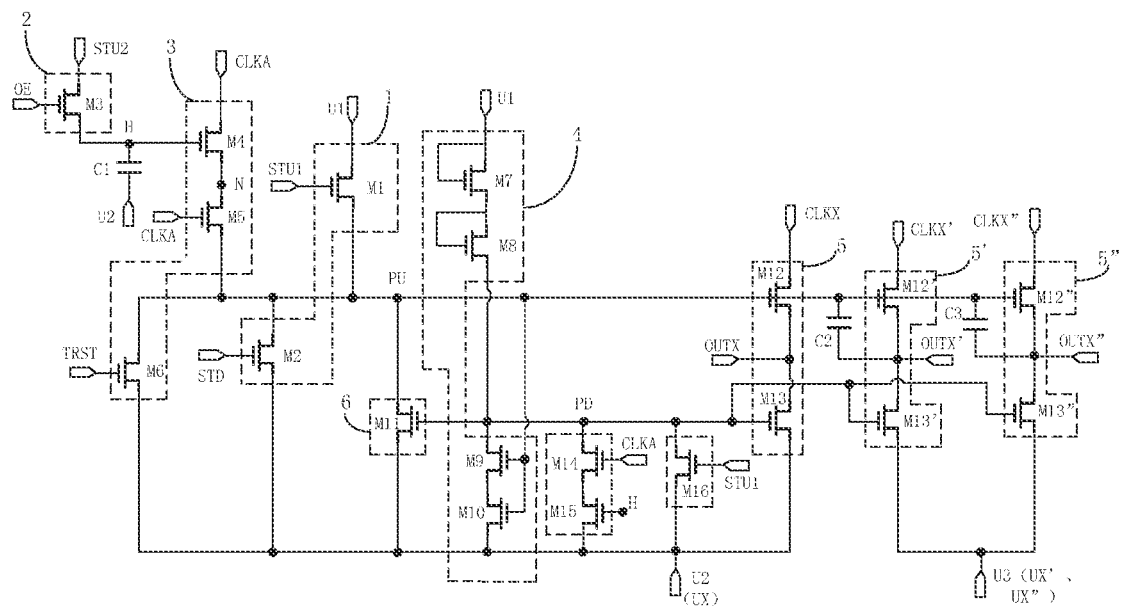
FIG. 9 is a schematic circuit diagram of a shift register according to an embodiment of the present disclosure.

FIG. 9 is another schematic circuit diagram of a shift register according to an embodiment of the present disclosure, and as shown in FIG. 9, different from the foregoing embodiment, in the present embodiment, the number of output sub-circuits is three, and accordingly, the number of signal output terminals is three, the number of driving clock signal terminals is three, and the number of reset power supply terminals is three. For convenience of distinction, in the embodiment, as shown in FIG. 9, the three output sub-circuits are a first output sub-circuit 5, a second output sub-circuit 5' and a third output sub-circuit 5", the three signal output terminals are a signal output terminal OUTX, a signal output terminal OUTX' and a signal output terminal OUTX", the three driving clock signal terminals are a driving clock signal terminal CLKX, a driving clock signal terminal CLKX' and a driving clock signal terminal CLKX", and the three reset power supply terminals are a reset power supply terminal UX, a reset power supply terminal UX' and a reset power supply terminal UX", respectively.

In the embodiment, the first output sub-circuit 5 includes a twelfth transistor M12 and a thirteenth transistor M13, and for the specific connection relationship of the twelfth transistor M12 and the thirteenth transistor M13, reference may be made to the description of the twelfth transistor and the thirteenth transistor in the foregoing embodiment, and details are not repeated here; the second output sub-circuit 5' includes a transistor M12' and a transistor M13', similarly, for the specific connection relationship of the transistor M12' and the transistor M13', reference may be made to the description of the twelfth transistor and the thirteenth transistor in the foregoing embodiment, and details are not repeated here; the third output sub-circuit 5" includes a transistor M12" and a transistor M13", similarly, for the specific connection relationship between the transistor M12" and the transistor M13", reference may be made to the description of the twelfth transistor and the thirteenth transistor in the foregoing embodiment, and details are not repeated here.

In the embodiment, the twelfth transistor M12 in the first output sub-circuit 5, the transistor M12' in the second output sub-circuit 5' and the transistor M12" in the third output sub-circuit 5" are turned on or off at the same time, and the thirteenth transistor M13 in the first output sub-circuit 5, the transistor M13' in the second output sub-circuit 5' and the transistor M13" in the third output sub-circuit 5" are turned on or off at the same time.

In some implementations, one of the three signal output terminals OUTX/OUTX'/OUTX" (e.g., the signal output terminal OUTX in FIG. 9) is configured to provide a cascade signal to another shift register in the gate driving circuit, and the other two signal output terminals OUTX'/OUTX" in FIG. 9 are configured to provide driving signals to the gate line G1 coupled to the control electrode of the display switch transistor QTFT and the gate line G2 coupled to the control electrode of the sensing switch transistor STFT in the pixel unit of the corresponding row, respectively.

Figure 10:
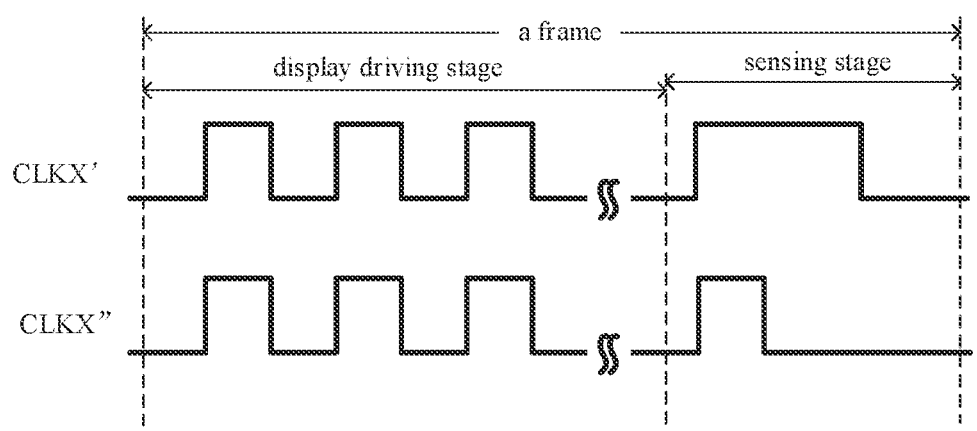
FIG. 10 is a timing diagram of two driving clock signal terminals CLKX'/CLKX" of FIG. 9 providing different driving clock signals.

In the embodiment, the driving clock signal terminal CLKX corresponding to the signal output terminal OUTX, the driving clock signal terminal CLKX' corresponding to the signal output terminal OUTX', and the driving clock signal terminal CLKX" corresponding to the signal output terminal OUTX" may be the same or different. For example, the driving clock signal of the driving clock signal terminal CLKX corresponding to the signal output terminal OUTX may be the same as the driving clock signal of the driving clock signal terminal CLKX'; the driving clock signal of the driving clock signal terminal CLKX' corresponding to the signal output terminal OUTX' and the driving clock signal of the driving clock signal terminal CLKX" corresponding to the signal output terminal OUTX" may be different. As an example, the operation timing when the driving clock signal terminal CLKX' corresponding to the signal output terminal OUTX' and the driving clock signal terminal CLKX" corresponding to the signal output terminal OUTX" provide different driving clock signals is shown in FIG. 10.

It should be understood that the operation timings of the three driving clock signal terminals CLKX, CLKX', and CLKX" may all be the same, i.e., the three driving clock signal terminals CLKX, CLKX', and CLKX" provide the same driving clock signal.

In some implementations, one of the three signal output terminals OUTX/OUTX'/OUTX" is configured to provide a driving signal to the gate line G2 coupled to the control electrode of the sensing switch transistor STFT in the pixel unit of the corresponding row, and the other two signal output terminals are configured to provide cascade signals to other shift registers in the gate driving circuit.

In the embodiment, the reset power supply terminal UX coupled to the first output sub-circuit 5, the reset power supply terminal UX' coupled to the second output sub-circuit 5', and the reset power supply terminal UX" coupled to the third output sub-circuit 5" may be the same power supply terminal or different power supply terminals.

In some implementations, as shown in FIG. 9, the reset power supply terminal UX coupled to the first output sub-circuit 5 is the second power supply terminal U2, the reset power supply terminal UX' coupled to the second output sub-circuit 5' and the reset power supply terminal UX" coupled to the third output sub-circuit 5" are both the third power supply terminal U3, where the second operating voltage VGL1 provided by the second power supply terminal U2 is lower than the third operating voltage VGL2 provided by the third power supply terminal U3, and both VGL1 and VGL2 are negative.

In some implementations, the reset power supply terminal UX coupled to the first output sub-circuit 5, the reset power supply terminal UX' coupled to the second output sub-circuit 5', and the reset power supply terminal UX" coupled to the third output sub-circuit 5" are all the third power supply terminal U3, and the third power supply terminal U3 is configured to provide the third operating voltage VGL2.

In the embodiment, a first terminal of the second capacitor C2 is coupled to the pull-up node PU, and a second terminal of the second capacitor C2 is coupled to the signal output terminal OUTX' corresponding to the second output sub-circuit 5'.

In the embodiment, the shift register further includes a third capacitor C3, a first terminal of the third capacitor C3 is coupled to the pull-up node PU, and a second terminal of the third capacitor C3 is coupled to the signal output terminal OUTX" corresponding to the third output sub-circuit 5".

In addition, for other descriptions of the shift register provided in the embodiment, reference may be made to the description of the foregoing embodiment, and details are not repeated here.

Figure 11:
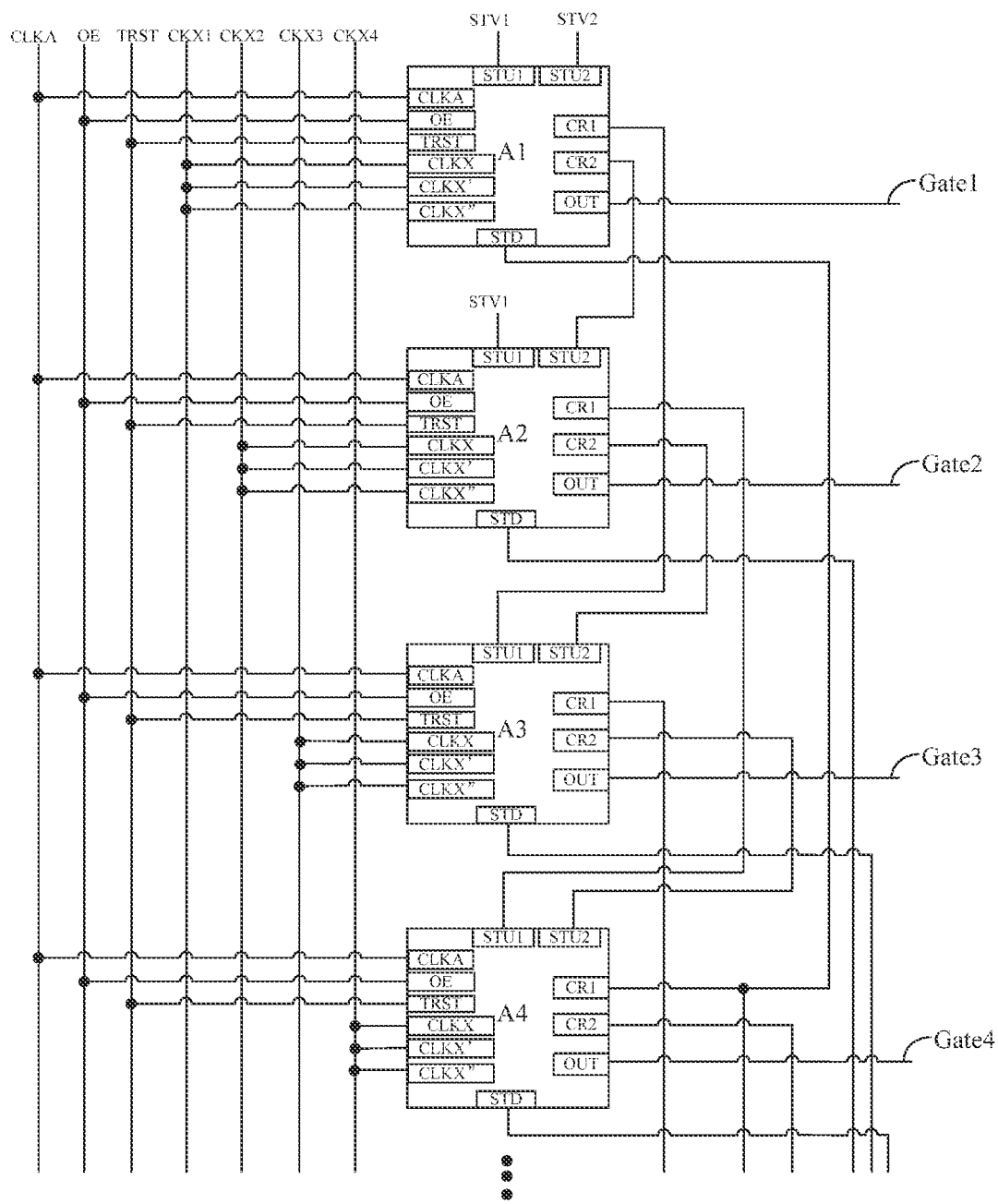
FIG. 11 is a schematic structural diagram of a gate driving circuit according to an embodiment of the present disclosure.

FIG. 11 is a schematic structural diagram of a gate driving circuit according to an embodiment of the present disclosure, and as shown in FIG. 11, the gate driving circuit includes: N shift registers A1/A2/A3/A4 . . . /AN which are cascaded and the shift registers A1/A2/A3/A4 . . . /AN each adopt the shift registers provided by any one of the above embodiments.

It should be noted that the schematic diagram of only first four stages of shift registers is given by way of example in the drawings.

In the embodiment, first signal input terminals STU1 of the shift registers A1/A2 at the first and second stages are coupled to a frame start signal input terminal STV1, the first signal input terminal STU1 of the shift register at the $i^{th}$ stage is coupled to one signal output terminal of the shift register at the $(i-2)^{th}$ stage, where i is greater than or equal to 3 and less than or equal to N, and i is a positive integer.

The second signal input terminal STU2 of the shift register at the first stage is coupled to a sensing start signal input terminal STV2, the second signal input terminal STU2 of the shift register at the $j^{th}$ stage is coupled to one signal output terminal of the shift register at the $(j-1)^{th}$ stage, where j is greater than or equal to 2 and less than or equal to N, and j is a positive integer.

Display reset signal terminals STD of the shift registers from the $(N-2)^{th}$ stage to the $N^{th}$ stage are coupled to a frame reset signal terminal (not shown), the display reset signal terminal STD at the $k^{th}$ stage is coupled to one signal output terminal of the shift register at the $(k+3)^{th}$ stage, where k is greater than or equal to 1 and less than or equal to N-3, and k is a positive integer.

As shown in FIG. 11, the first clock signal terminal CLKA of each shift register is coupled to the first clock signal line CLKA, the random signal terminal OE of each shift register is coupled to the random signal line OE, and the sensing reset signal terminal TRST of each shift register is coupled to the sensing reset signal line TRST.

In the embodiment, the gate driving circuit is provided with four clock signal lines CKX1/CKX2/CKX3/CKX4. As shown in FIG. 11, the driving clock signal terminal CLKX of the shift register at the $(4m-3)^{th}$ stage is coupled to the driving clock signal line CKX1, the driving clock signal terminal CLKX of the shift register at the $(4m-2)^{th}$ stage is coupled to the second driving clock signal line CKX2, the driving clock signal terminal CLKX of the shift register at the $(4m-1)^{th}$ stage is coupled to the third driving clock signal line CKX3, the driving clock signal terminal CLKX of the shift register at the $4m^{th}$ stage is coupled to the fourth driving clock signal line CKX4, m is greater than or equal to 1 and less than or equal to N, and m is a positive integer.

In the embodiment, as shown in FIG. 11, the driving clock signal terminal CLKX, the driving clock signal terminal CLKX', and the driving clock signal terminal CLKX" of the shift register at the same stage are coupled to the same clock signal line.

In some implementations, as shown in FIG. 11, each of the shift registers A1/A2/A3/A4 is coupled to three corresponding signal output terminals CR1/CR2/OUT, which are respectively a first cascade signal output terminal CR1 (for providing a cascade signal to another shift register in the gate driving circuit), a second cascade signal output terminal CR2 (for providing a cascade signal to another shift register in the gate driving circuit), and a first driving signal output terminal OUT (for providing a driving signal to the gate line G2 coupled to the control electrode of the sensing switch transistor STFT in the pixel unit of the corresponding row); the first signal input terminal STU1 of the shift register at the $i^{th}$ stage is coupled to the first cascade signal output terminal CR1 of the shift register at the $(i-2)^{th}$ stage; the second signal input terminal STU2 of the shift register at the $j^{th}$ stage is coupled to the second cascade signal output terminal CR2 of the shift register at the $(j-)^{th}$ stage; the display reset signal terminal STD of the shift register at the $k^{th}$ stage is coupled to the first cascade signal output terminal CR1 of the shift register at the $(k+3)^{th}$ stage. First driving signal output terminals OUT of the shift registers at the stages are respectively coupled to gate lines Gate1/Gate2/Gate3/Gate4 of corresponding rows.

Figure 12:
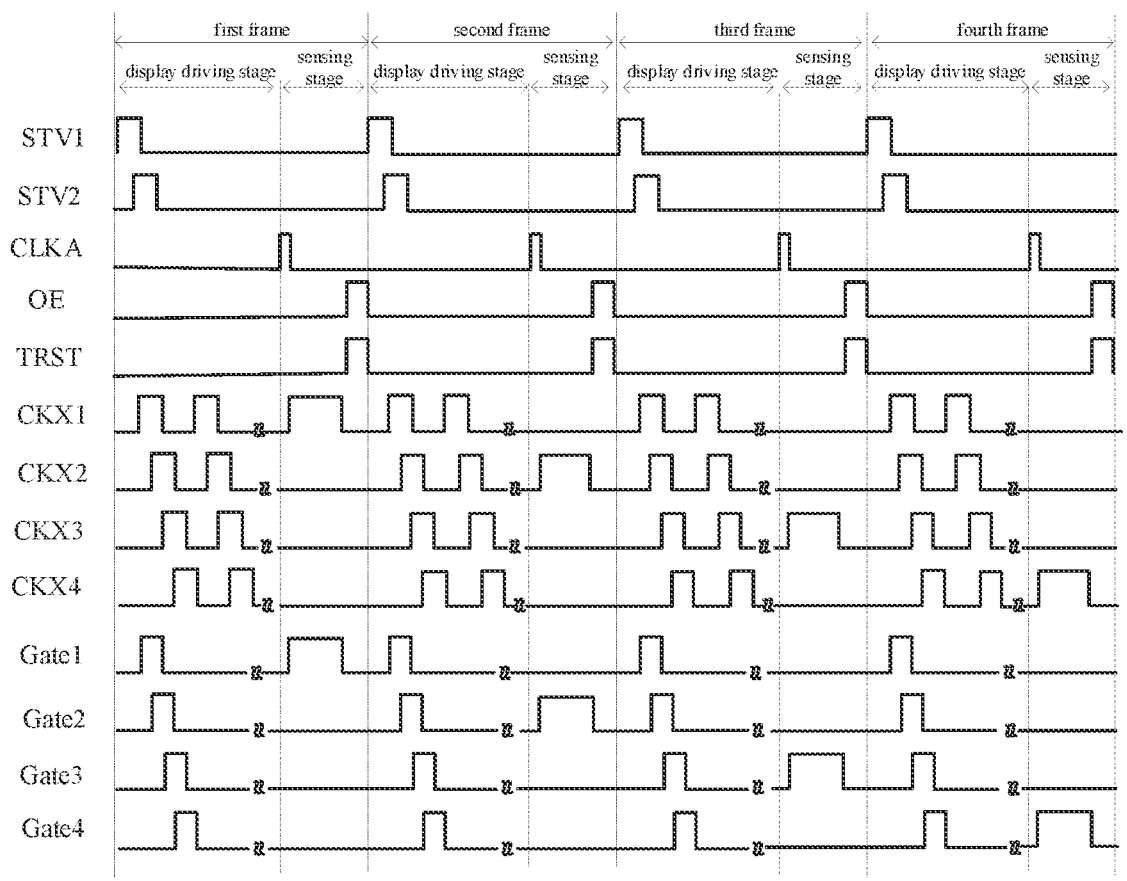
FIG. 12 is a timing diagram illustrating an operation of the gate driving circuit shown in FIG. 11.

FIG. 12 is a timing diagram illustrating the operation of the gate driving circuit shown in FIG. 11, as shown in FIG. 12, in the display driving stage of each frame, the shift registers A1/A2/A3/A4 sequentially outputs driving signals to the gate lines Gate1/Gate2/Gate3/Gate4 of corresponding rows, so as to drive the display panel to display an image; in the sensing stage of each frame, only the shift register at one stage outputs a driving signal to sense a current of a display element or driving transistor in the pixel unit of the corresponding row for an external compensation; each row of pixel units is externally compensated frame by frame.

It should be noted that, by controlling an overlap ratio of the driving clock signals supplied by the driving clock signal lines CKX1, CKX2, CKX3 and CKX4, an overlap ratio of the driving signals of adjacent rows of gate lines can be controlled.

An embodiment of the present disclosure further provides a display device, including the gate driving circuit provided in the above embodiment, and for details, reference is made to the description in the above embodiment, and details are not repeated here.

It is to be understood that the above embodiments and implementations are merely illustrative for illustrating the principles of the present disclosure, and the present disclosure is not limited thereto. It will be apparent to those ordinary skilled in the art that various changes and modifications can be made therein without departing from the spirit and scope of the present disclosure, and these changes and modifications are to be considered within the scope of the present disclosure.

The invention claimed is:

1. A shift register, comprising: a display pre-charge reset circuit, a sensing cascade circuit, a sensing pre-charge reset circuit, a pull-down control circuit and an output circuit; the sensing cascade circuit and the sensing pre-charge reset circuit are coupled to a sensing cascade node, the display pre-charge reset circuit, the sensing pre-charge reset circuit, the pull-down control circuit and the output circuit are coupled to a pull-up node, and the pull-down control circuit and the output circuit are coupled to a pull-down node; the output circuit is coupled to at least one signal output terminal and comprises output sub-circuits in one-to-one correspondence with the at least one signal output terminal;

the display pre-charge reset circuit is coupled to a first signal input terminal, a display reset signal terminal, a first power supply terminal and a second power supply terminal, and is configured to write, in response to a control of a first input signal provided by the first signal input terminal in a display pre-charge stage, a first operating voltage provided by the first power supply terminal and in an effective level state into the pull-up node; and to write, in response to a control of a first reset signal provided by the display reset signal terminal in a display reset stage, a second operating voltage provided by the second power supply terminal and in a non-effective level state into the pull-up node;

the sensing cascade circuit is coupled to a second signal input terminal and a random signal terminal, and is configured to write, in response to a control of a random signal provided by the random signal terminal in a sensing cascade stage, a second input signal provided by the second signal input terminal and in an effective level state into the sensing cascade node;

the sensing pre-charge reset circuit is coupled to a first clock signal terminal, a sensing reset signal terminal and the second power supply terminal, and is configured to write, in response to a control of a voltage of the sensing cascade node and a first clock signal provided by the first clock signal terminal in a sensing pre-charge stage, the first clock signal provided by the first clock signal terminal and in an effective level state into the pull-up node; and to write, in response to a control of a second reset signal provided by the sensing reset signal terminal in a sensing reset stage, the second operating voltage provided by the second power supply terminal and in the non-effective level state into the pull-up node;

the pull-down control circuit is coupled to the first power supply terminal and the second power supply terminal, and is configured to write, in response to a control of a voltage of the pull-up node when the voltage of the pull-up node is in an effective level state, the second operating voltage provided by the second power supply terminal and in the non-effective level state into the pull-down node; and to write, in response to a control of the first operating voltage provided by the first power supply terminal when the voltage of the pull-up node is in a non-effective level state, the first operating voltage provided by the first power supply terminal and in the effective level state into the pull-down node;

each output sub-circuit is coupled to the pull-up node, the pull-down node, a corresponding signal output terminal, a corresponding driving clock signal terminal and a corresponding reset power supply terminal, and is configured to write, in response to the control of the voltage of the pull-up node in the effective level state in a display output stage and a sensing output stage, a driving clock signal provided by the corresponding driving clock signal terminal into the corresponding signal output terminal; and to write, in response to the control of the voltage of the pull-down node in the effective level state in the display reset stage and the sensing reset stage, the reset operating voltage provided by the corresponding reset power supply terminal and in the non-effective level state into the corresponding signal output terminal, wherein the sensing cascade circuit comprises a third transistor;

a control electrode of the third transistor is coupled to the random signal terminal, a first electrode of the third transistor is directly coupled to the second signal input terminal, and a second electrode of the third transistor is directly coupled to the sensing cascade node, wherein the sensing pre-charge reset circuit comprises a fourth transistor, a fifth transistor and a sixth transistor;

a control electrode of the fourth transistor is coupled to the sensing cascade node, a first electrode of the fourth transistor is coupled to the first clock signal terminal, and a second electrode of the fourth transistor is coupled to a sensing pre-charge node;

a control electrode of the fifth transistor is coupled to the first clock signal terminal, a first electrode of the fifth transistor is coupled to the sensing pre-charge node, and a second electrode of the fifth transistor is coupled to the pull-up node;

a control electrode of the sixth transistor is coupled to the sensing reset signal terminal, a first electrode of the sixth transistor is coupled to the pull-up node, and a second electrode of the sixth transistor is coupled to the second power supply terminal, and wherein the shift register further comprises a first capacitor having a first terminal coupled to the sensing cascade node and a second terminal coupled to the second power supply terminal.

2. The shift register of claim 1, wherein the display pre-charge reset circuit comprises a first transistor and a second transistor;

a control electrode of the first transistor is coupled to the first signal input terminal, a first electrode of the first transistor is coupled to the first power supply terminal, and a second electrode of the first transistor is coupled to the pull-up node;

a control electrode of the second transistor is coupled to the display reset signal terminal, a first electrode of the second transistor is coupled to the pull-up node, and a second electrode of the second transistor is coupled to the second power supply terminal.

3. A gate driving circuit, comprising N shift registers which are cascaded, wherein each of the shift registers adopts the shift register of claim 2;

first signal input terminals of the shift registers at the first stage and the second stage are coupled to a frame start signal input terminal, the first signal input terminal of the shift register at the $i^{th}$ stage is coupled to one signal output terminal of the shift register at the $(i-2)^{th}$ stage, wherein i is greater than or equal to 3 and less than or equal to N, and i is a positive integer;

the second signal input terminal of the shift register at the first stage is coupled to a sensing start signal input terminal, the second signal input terminal of the shift register at the $j^{th}$ stage is coupled to one signal output terminal of the shift register at the $(j-1)^{th}$ stage, wherein j is greater than or equal to 2 and less than or equal to N, and j is a positive integer;

display reset signal terminals of the shift registers from the $(N-2)^{th}$ stage to the $N^{th}$ stage are coupled to a frame reset signal terminal, the display reset signal terminal of the $k^{th}$ stage is coupled to one signal output terminal of the shift register at the $(k+3)^{th}$ stage, wherein k is greater than or equal to 1 and less than or equal to N−3, and k is a positive integer.

4. The shift register of claim 1, further comprising: a first noise reduction circuit comprising an eleventh transistor;
a control electrode of the eleventh transistor is coupled to the pull-down node, a first electrode of the eleventh transistor is coupled to the pull-up node, and a second electrode of the eleventh transistor is coupled to the second power supply terminal.

5. The shift register of claim 1, wherein the at least one signal output terminal comprises one signal output terminal, and the shift register further comprises a second capacitor, a first terminal of said second capacitor is coupled to the pull-up node, a second terminal of the second capacitor is coupled to the signal output terminal.

6. The shift register of claim 1, wherein the at least one signal output terminal comprises three signal output terminals, the output circuit comprises three output sub-circuits, and the shift register further comprises a second capacitor and a third capacitor;
a first terminal of the second capacitor is coupled to the pull-up node, and a second terminal of the second capacitor is coupled to one of the signal output terminals corresponding to one output sub-circuit;
a first terminal of the third capacitor is coupled to the pull-up node, and a second terminal of the third capacitor is coupled to one of the signal output terminals corresponding to another output sub-circuit.

7. The shift register of claim 1, wherein each of the output sub-circuits comprises a twelfth transistor and a thirteenth transistor;
a control electrode of the twelfth transistor is coupled to the pull-up node, a first electrode of the twelfth transistor is coupled to the driving clock signal terminal corresponding to the output sub-circuit, and a second electrode of the twelfth transistor is coupled to the signal output terminal corresponding to the output sub-circuit;
a control electrode of the thirteenth transistor is coupled to the pull-down node, a first electrode of the thirteenth transistor is coupled to the signal output terminal corresponding to the output sub-circuit, and a second electrode of the thirteenth transistor is coupled to the reset power supply terminal corresponding to the output sub-circuit.

8. The shift register of claim 1, further comprising: a second noise reduction circuit comprising a fourteenth transistor and a fifteenth transistor;
a control electrode of the fourteenth transistor is coupled to the first clock signal terminal, a first electrode of the fourteenth transistor is coupled to the pull-down node, and a second electrode of the fourteenth transistor is coupled to a first electrode of the fifteenth transistor;
a control electrode of the fifteenth transistor is coupled to the sensing cascade node, and a second electrode of the fifteenth transistor is coupled to the second power supply terminal.

9. The shift register of claim 1, further comprising: a third noise reduction circuit comprising a sixteenth transistor;
a control electrode of the sixteenth transistor is coupled to the first signal input terminal, a first electrode of the sixteenth transistor is coupled to the pull-down node, and a second electrode of the sixteenth transistor is coupled to the second power supply terminal.

10. A gate driving circuit, comprising N shift registers which are cascaded, wherein each of the shift registers adopts the shift register of claim 1;
first signal input terminals of the shift registers at the first stage and the second stage are coupled to a frame start signal input terminal, the first signal input terminal of the shift register at the $i^{th}$ stage is coupled to one signal output terminal of the shift register at the $(i-2)^{th}$ stage, wherein i is greater than or equal to 3 and less than or equal to N, and i is a positive integer;
the second signal input terminal of the shift register at the first stage is coupled to a sensing start signal input terminal, the second signal input terminal of the shift register at the $j^{th}$ stage is coupled to one signal output terminal of the shift register at the $(j-1)^{th}$ stage, wherein j is greater than or equal to 2 and less than or equal to N, and j is a positive integer;
display reset signal terminals of the shift registers from the $(N-2)^{th}$ stage to the $N^{th}$ stage are coupled to a frame reset signal terminal, the display reset signal terminal of the $k^{th}$ stage is coupled to one signal output terminal of the shift register at the $(k+3)^{th}$ stage, wherein k is greater than or equal to 1 and less than or equal to N−3, and k is a positive integer.

11. A display device comprising the gate driver circuit according to claim 10.

12. The shift register of claim 1, wherein the pull-down control circuit comprises a seventh transistor, an eighth transistor, a ninth transistor and a tenth transistor;
a control electrode of the seventh transistor is coupled to the first power supply terminal, a first electrode of the seventh transistor is coupled to the first power supply terminal, and a second electrode of the seventh transistor is coupled to a first electrode of the eighth transistor;
a control electrode of the eighth transistor is coupled to the first electrode of the eighth transistor, and a second electrode of the eighth transistor is coupled to the pull-down node;
a control electrode of the ninth transistor is coupled to the pull-up node, a first electrode of the ninth transistor is coupled to the pull-down node, and a second electrode of the ninth transistor is coupled to a first electrode of the tenth transistor;
a control electrode of the tenth transistor is coupled to the pull-up node, and a second electrode of the tenth transistor is coupled to the second power supply terminal.

13. A shift register, comprising a first transistor, a second transistor, a third transistor, a fourth transistor, a fifth transistor, a sixth transistor, a seventh transistor, an eighth transistor, a ninth transistor, a tenth transistor, an eleventh transistor, a twelfth transistor, a twenty-second transistor, a thirty-second transistor, a thirteenth transistor, a twenty-third transistor, a thirty-third transistor, a fourteenth transistor, a fifteenth transistor, a sixteenth transistor, a first capacitor, a second capacitor and a third capacitor,
a control electrode of the first transistor is coupled to a first signal input terminal, a first electrode of the first transistor is coupled to a first power supply terminal, and a second electrode of the first transistor is coupled to a pull-up node;
a control electrode of the second transistor is coupled to a display reset signal terminal, a first electrode of the second transistor is coupled to the pull-up node, and a second electrode of the second transistor is coupled to a second power supply terminal;

a control electrode of the third transistor is coupled to a random signal terminal, a first electrode of the third transistor is coupled to a second signal input terminal, and a second electrode of the third transistor is coupled to a sensing cascade node;

a control electrode of the fourth transistor is coupled to the sensing cascade node, a first electrode of the fourth transistor is coupled to a first clock signal terminal, and a second electrode of the fourth transistor is coupled to a sensing pre-charge node;

a control electrode of the fifth transistor is coupled to the first clock signal terminal, a first electrode of the fifth transistor is coupled to the sensing pre-charge node, and a second electrode of the fifth transistor is coupled to the pull-up node;

a control electrode of the sixth transistor is coupled to a sensing reset signal terminal, a first electrode of the sixth transistor is coupled to the pull-up node, and a second electrode of the sixth transistor is coupled to the second power supply terminal;

a control electrode of the seventh transistor is coupled to the first power supply terminal, a first electrode of the seventh transistor is coupled to the first power supply terminal, and a second electrode of the seventh transistor is coupled to a first electrode of the eighth transistor;

a control electrode of the eighth transistor is coupled to the first electrode of the eighth transistor, and a second electrode of the eighth transistor is coupled to a pull-down node;

a control electrode of the ninth transistor is coupled to the pull-up node, a first electrode of the ninth transistor is coupled to the pull-down node, and a second electrode of the ninth transistor is coupled to a first electrode of the tenth transistor;

a control electrode of the tenth transistor is coupled to the pull-up node, and a second electrode of the tenth transistor is coupled to the second power supply terminal;

a control electrode of the eleventh transistor is coupled to the pull-down node, a first electrode of the eleventh transistor is coupled to the pull-up node, and a second electrode of the eleventh transistor is coupled to the second power supply terminal;

a control electrode of the twelfth transistor is coupled to the pull-up node, a first electrode of the twelfth transistor is coupled to a first driving clock signal terminal, and a second electrode of the first twelfth transistor is coupled to a first signal output terminal;

a control electrode of the twenty-second transistor is coupled to the pull-up node, a first electrode of the twenty-second transistor is coupled to a second driving clock signal terminal, and a second electrode of the twenty-second transistor is coupled to a second signal output terminal;

a control electrode of the thirty-second transistor is coupled to the pull-up node, a first electrode of the thirty-second transistor is coupled to a third driving clock signal terminal, and a second electrode of the thirty-second transistor is coupled to a third signal output terminal;

a control electrode of the thirteenth transistor is coupled to the pull-down node, a first electrode of the thirteenth transistor is coupled to the first signal output terminal, and a second electrode of the thirteenth transistor is coupled to a first reset power supply terminal;

a control electrode of the twenty-third transistor is coupled to the pull-down node, a first electrode of the twenty-third transistor is coupled to the second signal output terminal, and a second electrode of the twenty-third transistor is coupled to a second reset power supply terminal;

a control electrode of the thirty-third transistor is coupled to the pull-down node, a first electrode of the thirty-third transistor is coupled to the third signal output terminal, and a second electrode of the thirty-third transistor is coupled to a third reset power supply terminal;

a control electrode of the fourteenth transistor is coupled to the first clock signal terminal, a first electrode of the fourteenth transistor is coupled to the pull-down node, and a second electrode of the fourteenth transistor is coupled to a first electrode of the fifteenth transistor;

a control electrode of the fifteenth transistor is coupled to the sensing cascade node, and a second electrode of the fifteenth transistor is coupled to the second power supply terminal;

a control electrode of the sixteenth transistor is coupled to the first signal input terminal, a first electrode of the sixteenth transistor is coupled to the pull-down node, and a second electrode of the sixteenth transistor is coupled to the second power supply terminal;

a first terminal of the first capacitor is coupled to the sensing cascade node, and a second terminal of the first capacitor is coupled to the second power supply terminal;

a first terminal of the second capacitor is coupled to the pull-up node, and a second terminal of the second capacitor is coupled to the second signal output terminal; and a first terminal of the third capacitor is coupled to the pull-up node, and a second terminal of the third capacitor is coupled to the third signal output terminal.

14. A gate driving circuit, comprising N shift registers which are cascaded, wherein each of the shift registers adopts the shift register of claim 13;

first signal input terminals of the shift registers at the first stage and the second stage are coupled to a frame start signal input terminal, the first signal input terminal of the shift register at the $i^{th}$ stage is coupled to one signal output terminal of the shift register at the $(i-2)^{th}$ stage, wherein i is greater than or equal to 3 and less than or equal to N, and i is a positive integer;

the second signal input terminal of the shift register at the first stage is coupled to a sensing start signal input terminal, the second signal input terminal of the shift register at the $j^{th}$ stage is coupled to one signal output terminal of the shift register at the $(j-1)^{th}$ stage, wherein j is greater than or equal to 2 and less than or equal to N, and j is a positive integer;

display reset signal terminals of the shift registers from the $(N-2)^{th}$ stage to the $N^{th}$ stage are coupled to a frame reset signal terminal, the display reset signal terminal of the $k^{th}$ stage is coupled to one signal output terminal of the shift register at the $(k+3)^{th}$ stage, wherein k is greater than or equal to 1 and less than or equal to N−3, and k is a positive integer.

15. A shift register, comprising: a display pre-charge reset circuit, a sensing cascade circuit, a sensing pre-charge reset circuit, a pull-down control circuit and an output circuit; the sensing cascade circuit and the sensing pre-charge reset circuit are coupled to a sensing cascade node, the display pre-charge reset circuit, the sensing pre-charge reset circuit, the pull-down control circuit and the output circuit are coupled to a pull-up node, and the pull-down control circuit and the output circuit are coupled to a pull-down node; the output circuit is coupled to at least one signal output terminal and comprises output sub-circuits in one-to-one correspondence with the at least one signal output terminal;

the display pre-charge reset circuit is coupled to a first signal input terminal, a display reset signal terminal, a first power supply terminal and a second power supply terminal, and is configured to write, in response to a control of a first input signal provided by the first signal input terminal in a display pre-charge stage, a first operating voltage provided by the first power supply terminal and in an effective level state into the pull-up node; and to write, in response to a control of a first reset signal provided by the display reset signal terminal in a display reset stage, a second operating voltage provided by the second power supply terminal and in a non-effective level state into the pull-up node;

the sensing cascade circuit is coupled to a second signal input terminal and a random signal terminal, and is configured to write, in response to a control of a random signal provided by the random signal terminal in a sensing cascade stage, a second input signal provided by the second signal input terminal and in an effective level state into the sensing cascade node;

the sensing pre-charge reset circuit is coupled to a first clock signal terminal, a sensing reset signal terminal and the second power supply terminal, and is configured to write, in response to a control of a voltage of the sensing cascade node and a first clock signal provided by the first clock signal terminal in a sensing pre-charge stage, the first clock signal provided by the first clock signal terminal and in an effective level state into the pull-up node; and to write, in response to a control of a second reset signal provided by the sensing reset signal terminal in a sensing reset stage, the second operating voltage provided by the second power supply terminal and in the non-effective level state into the pull-up node;

the pull-down control circuit is coupled to the first power supply terminal and the second power supply terminal, and is configured to write, in response to a control of a voltage of the pull-up node when the voltage of the pull-up node is in an effective level state, the second operating voltage provided by the second power supply terminal and in the non-effective level state into the pull-down node; and to write, in response to a control of the first operating voltage provided by the first power supply terminal when the voltage of the pull-up node is in a non-effective level state, the first operating voltage provided by the first power supply terminal and in the effective level state into the pull-down node;

each output sub-circuit is coupled to the pull-up node, the pull-down node, a corresponding signal output terminal, a corresponding driving clock signal terminal and a corresponding reset power supply terminal, and is configured to write, in response to the control of the voltage of the pull-up node in the effective level state in a display output stage and a sensing output stage, a driving clock signal provided by the corresponding driving clock signal terminal into the corresponding signal output terminal; and to write, in response to the control of the voltage of the pull-down node in the effective level state in the display reset stage and the sensing reset stage, the reset operating voltage provided by the corresponding reset power supply terminal and in the non-effective level state into the corresponding signal output terminal, wherein the display pre-charge reset circuit comprises a first transistor and a second transistor;

a control electrode of the first transistor is coupled to the first signal input terminal, a first electrode of the first transistor is coupled to the first power supply terminal, and a second electrode of the first transistor is coupled to the pull-up node;

a control electrode of the second transistor is coupled to the display reset signal terminal, a first electrode of the second transistor is coupled to the pull-up node, and a second electrode of the second transistor is coupled to the second power supply terminal, wherein the sensing cascade circuit comprises a third transistor;

a control electrode of the third transistor is coupled to the random signal terminal, a first electrode of the third transistor is directly coupled to the second signal input terminal, and a second electrode of the third transistor is directly coupled to the sensing cascade node, wherein the sensing pre-charge reset circuit comprises a fourth transistor, a fifth transistor and a sixth transistor;

a control electrode of the fourth transistor is coupled to the sensing cascade node, a first electrode of the fourth transistor is coupled to the first clock signal terminal, and a second electrode of the fourth transistor is coupled to a sensing pre-charge node;

a control electrode of the fifth transistor is coupled to the first clock signal terminal, a first electrode of the fifth transistor is coupled to the sensing pre-charge node, and a second electrode of the fifth transistor is coupled to the pull-up node;

a control electrode of the sixth transistor is coupled to the sensing reset signal terminal, a first electrode of the sixth transistor is coupled to the pull-up node, and a second electrode of the sixth transistor is coupled to the second power supply terminal, and wherein the shift register further comprises a first capacitor having a first terminal coupled to the sensing cascade node and a second terminal coupled to the second power supply terminal.

* * * * *